United States Patent [19]
Bok et al.

[11] Patent Number: 5,194,406
[45] Date of Patent: Mar. 16, 1993

[54] INSTALLATION FOR TRANSPORT AND PROCESSING UNDER A PULSATING DOUBLE-FLOATING CONDITION

[76] Inventors: Edward Bok, 1171 DR, Badhoevedorp; Ronald J. W. Barlag, NL-1314 KW, Almerstad, both of Netherlands

[21] Appl. No.: 474,818
[22] PCT Filed: Nov. 30, 1989
[86] PCT No.: PCT/NL89/00092
§ 371 Date: Jul. 24, 1990
§ 102(e) Date: Jul. 24, 1990
[87] PCT Pub. No.: WO90/06590
PCT Pub. Date: Jun. 14, 1990

[30] Foreign Application Priority Data
Dec. 1, 1988 [NL] Netherlands ............... 8802963

[51] Int. Cl.$^5$ .................. H01L 21/00; H01L 21/02; B08B 5/04
[52] U.S. Cl. ................. 437/225; 437/228; 118/50; 118/715; 118/719; 118/729
[58] Field of Search ............... 437/225, 228; 118/620, 118/630, 50, 50.1, 715, 719, 729

[56] References Cited

U.S. PATENT DOCUMENTS

| | | | |
|---|---|---|---|
| 4,226,526 | 10/1980 | Spence-Bate et al. | 355/53 |
| 4,278,366 | 7/1981 | Loveless et al. | 406/88 |
| 4,495,024 | 1/1985 | Bok | 156/646 |
| 4,560,590 | 12/1985 | Bok | 427/294 |
| 4,663,197 | 5/1987 | Bok | 156/646 |
| 4,681,776 | 7/1987 | Bok | 156/345 |

Primary Examiner—Brian E. Hearn
Assistant Examiner—B. Everhart
Attorney, Agent, or Firm—David H. Semmes

[57] ABSTRACT

Installation (10) for processing of successive wafers (26) under pulsating double-floating condition within processing gaps (174) and (176) above and underneath such wafer of an at least almost entirely sealed-off processing chamber (24) by means of a reciprocating upper chamber wall (34) immediately above this wafer, and with wafer supply and discharge toward and from this chamber also under pulsating double-floating condition.

27 Claims, 23 Drawing Sheets

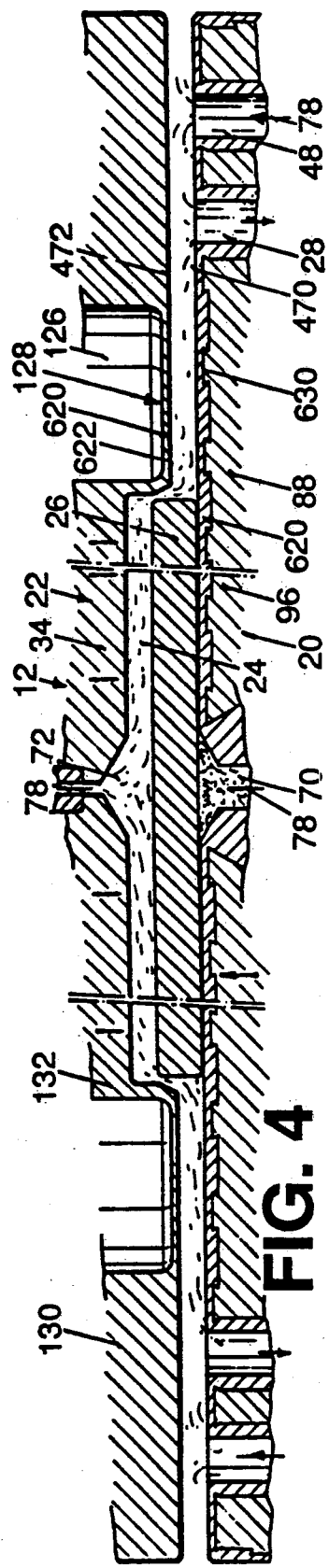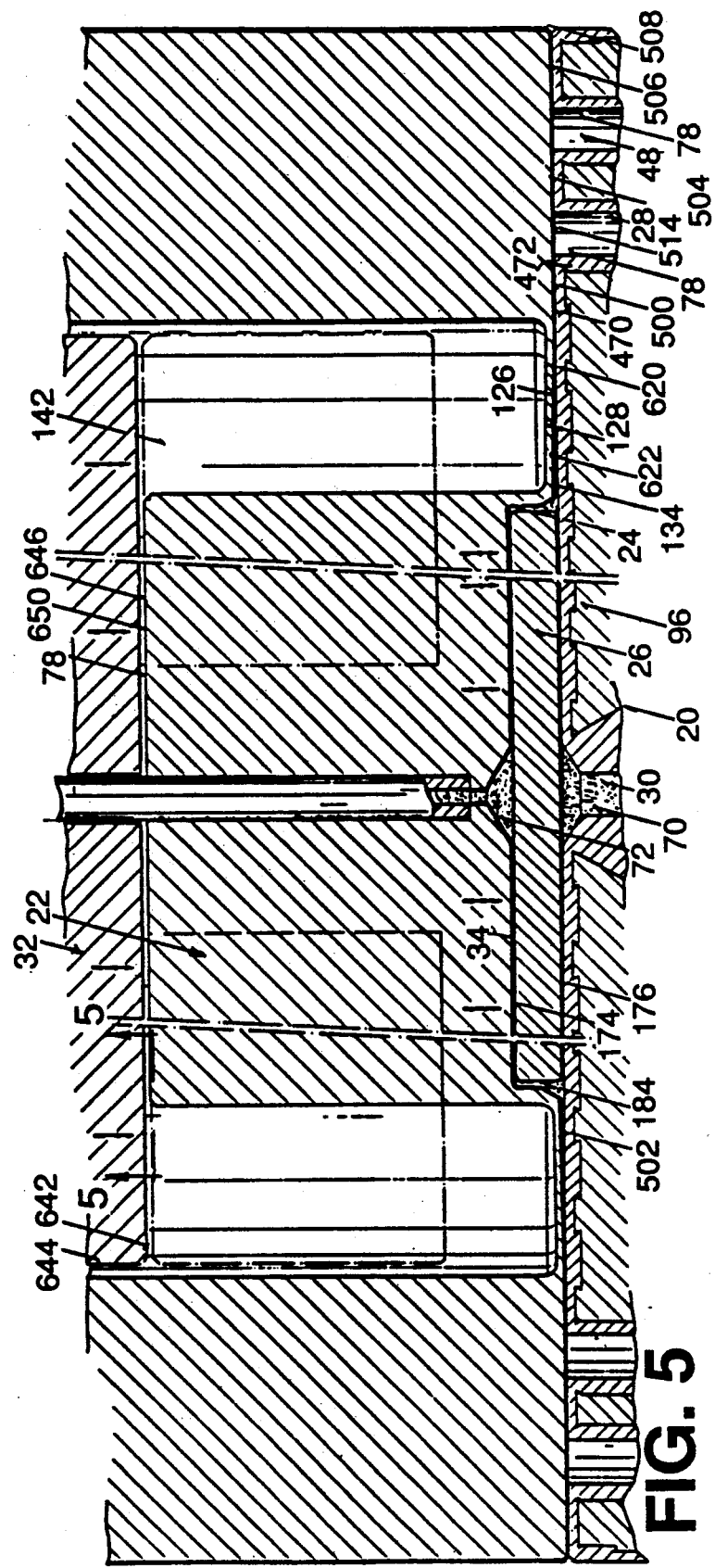

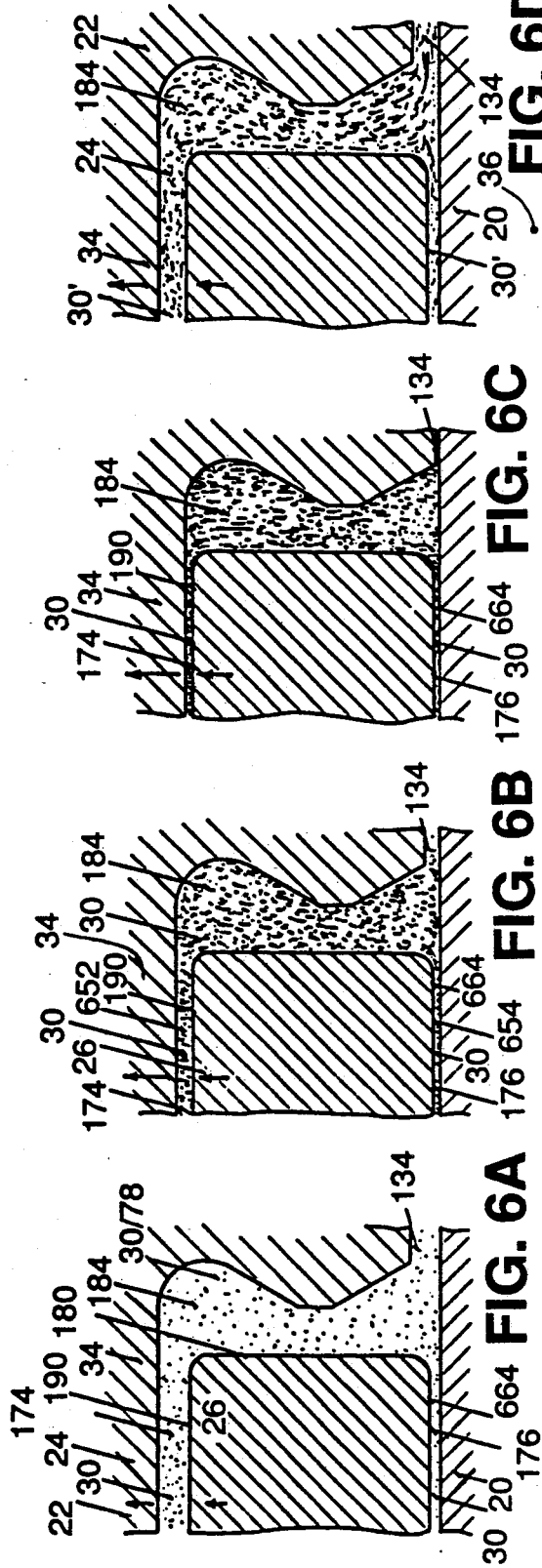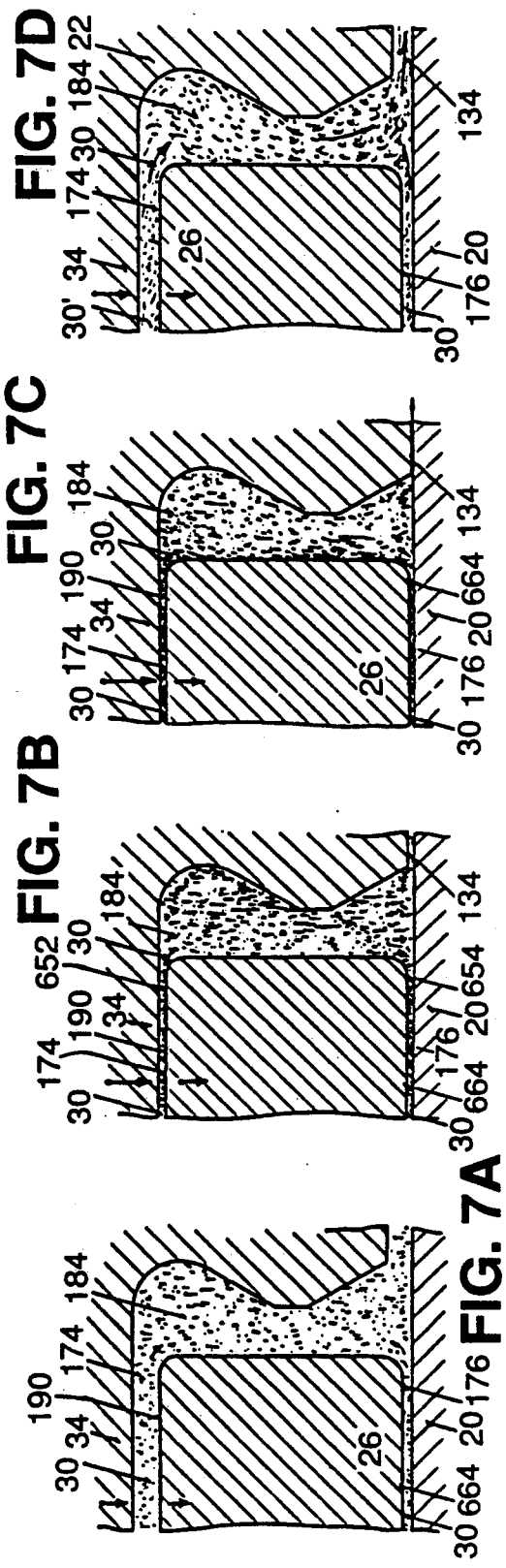

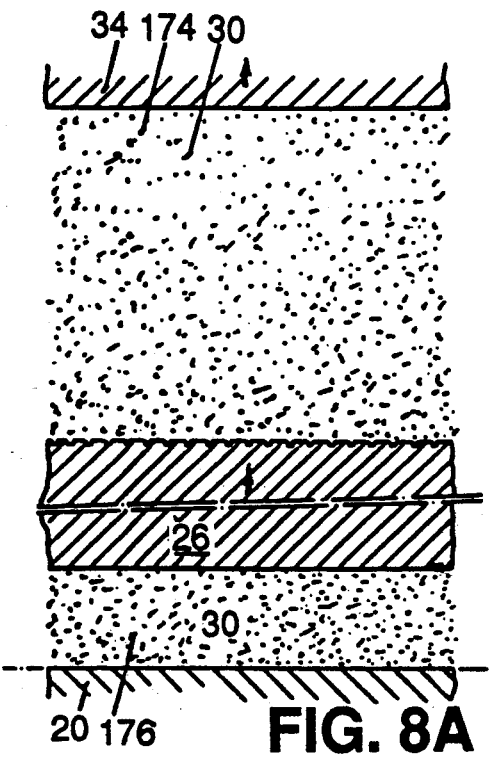
FIG. 8A
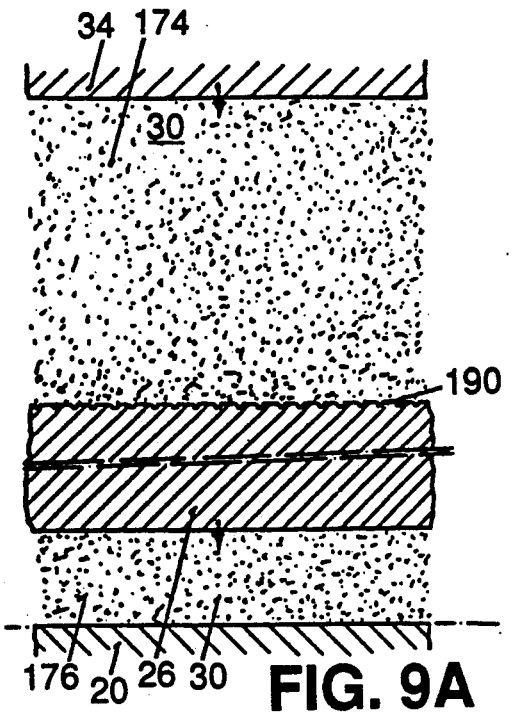
FIG. 9A
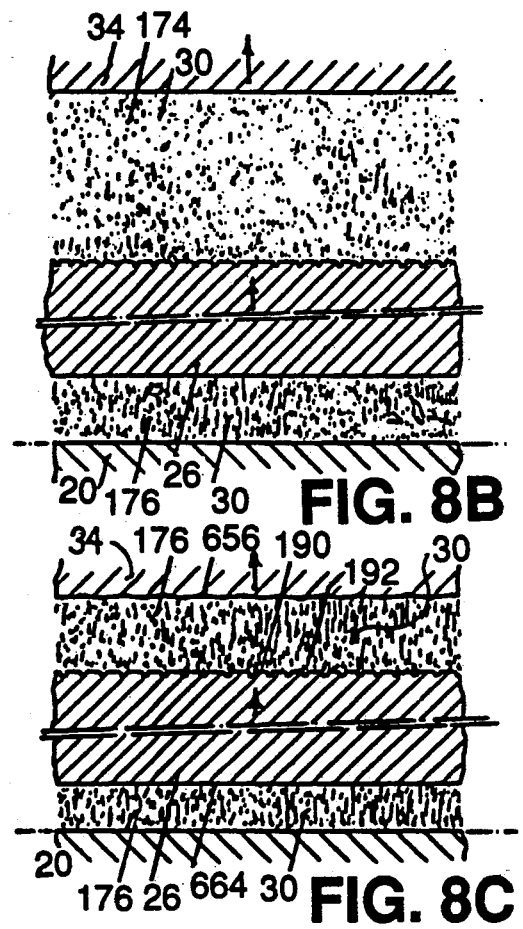
FIG. 8B
FIG. 8C
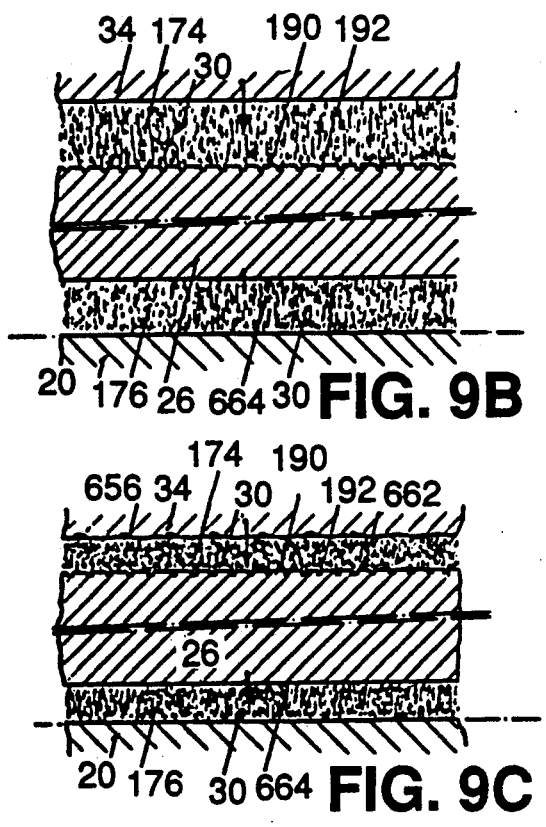
FIG. 9B
FIG. 9C

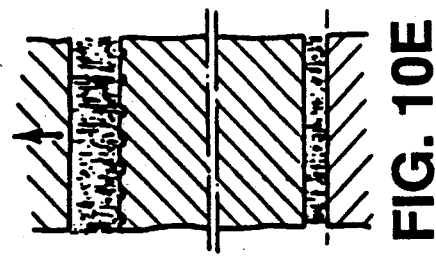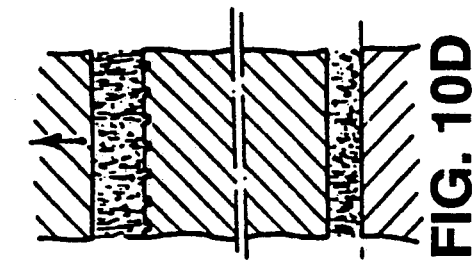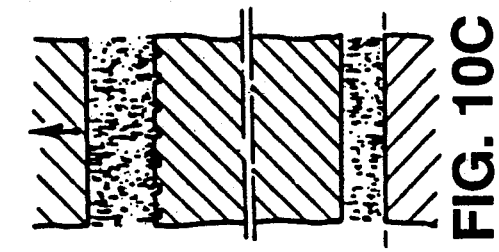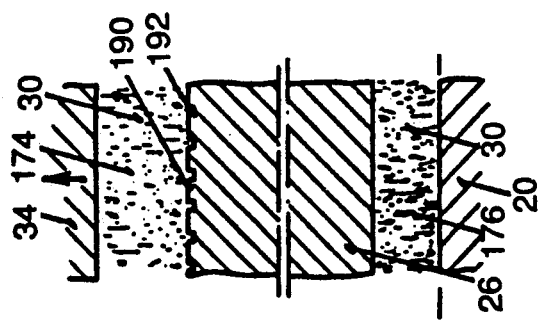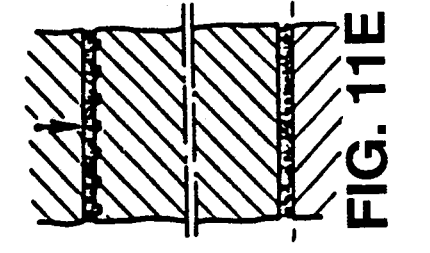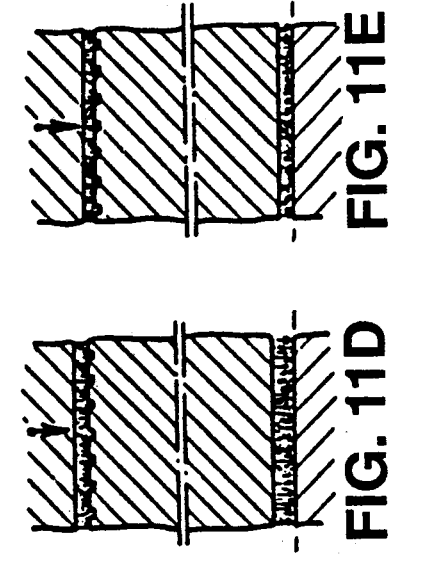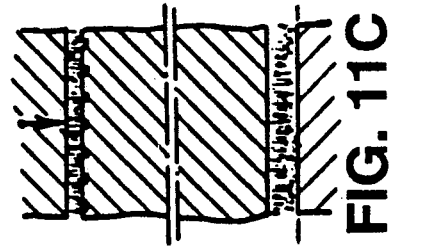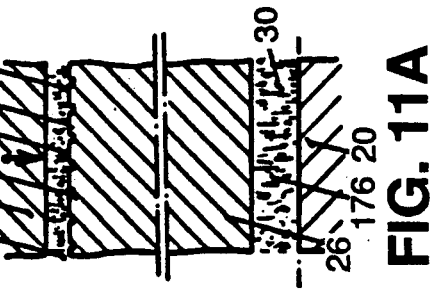

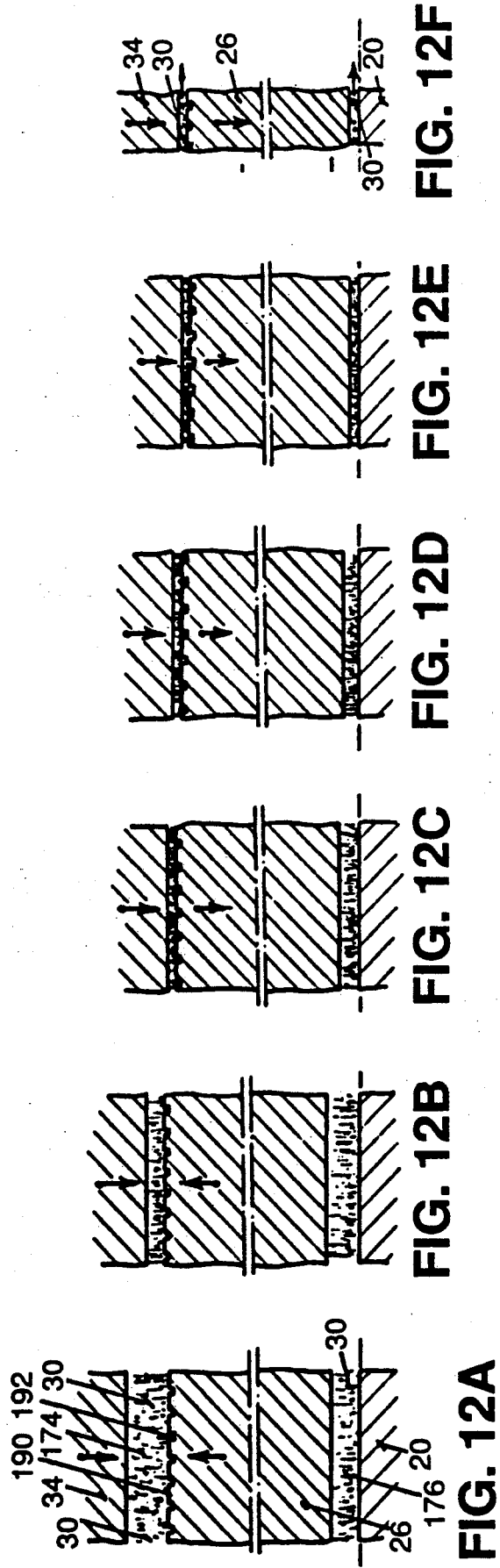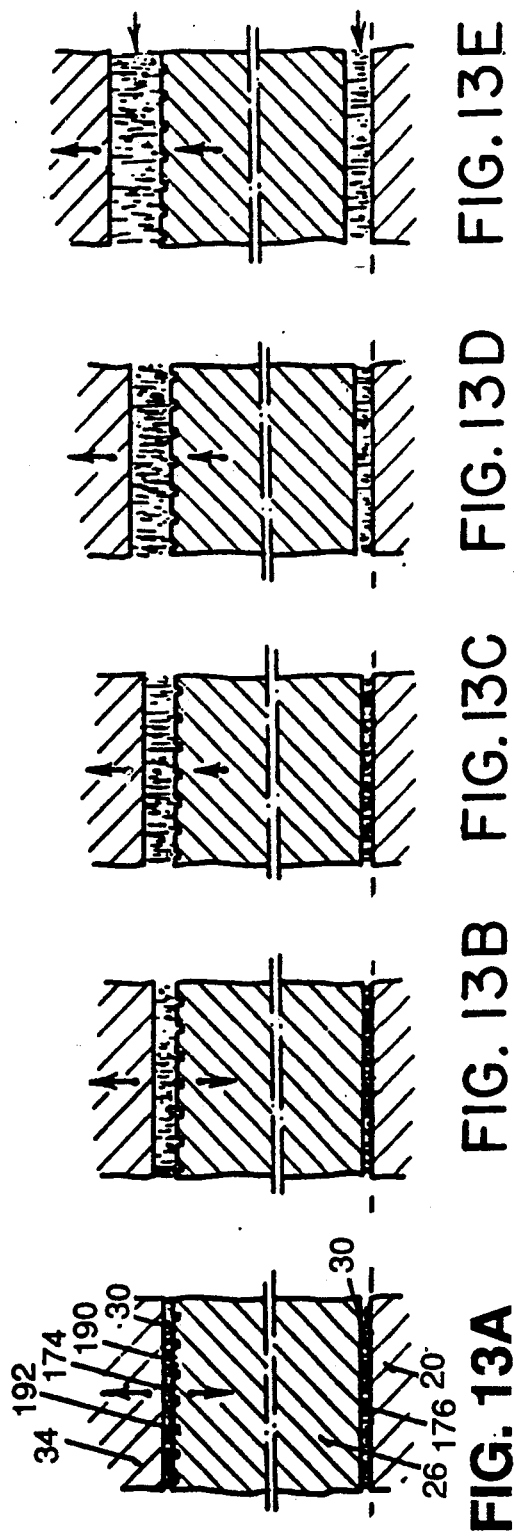

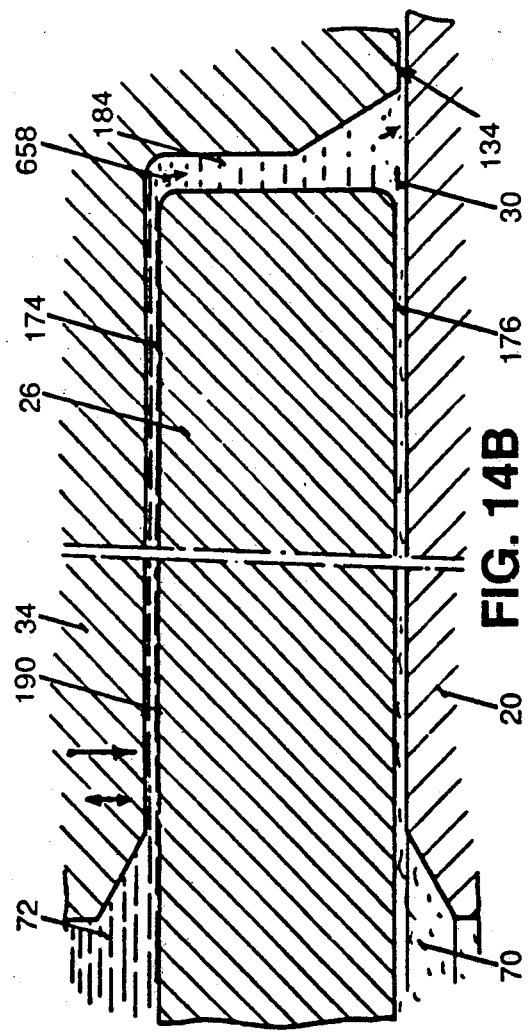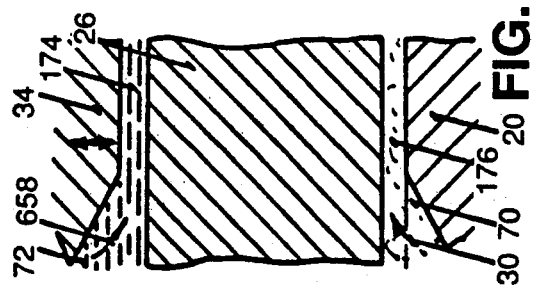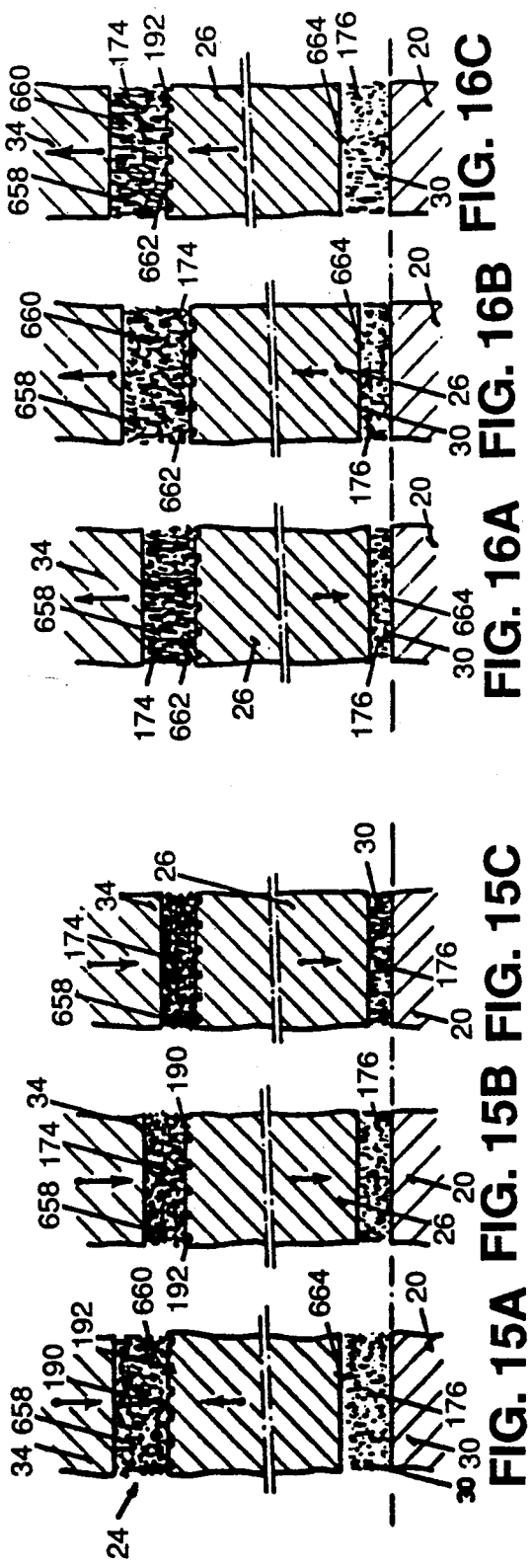

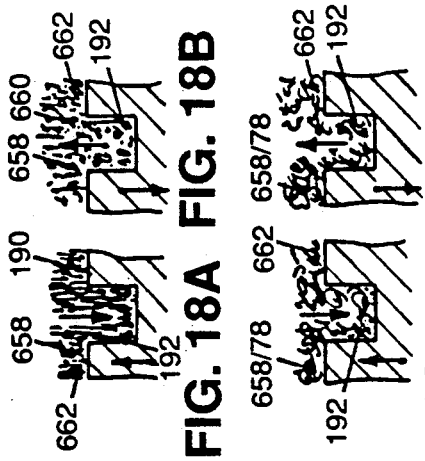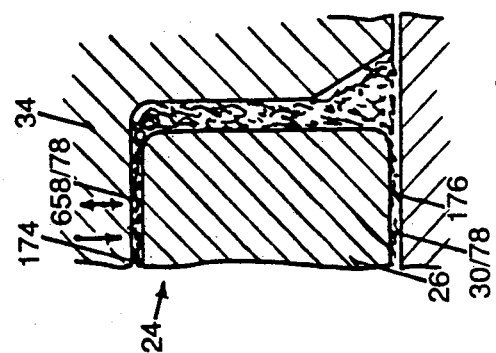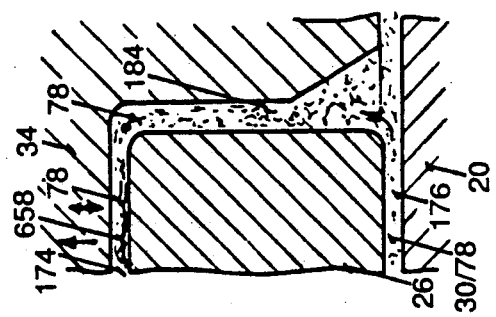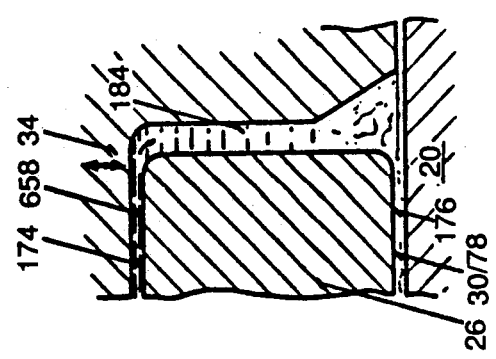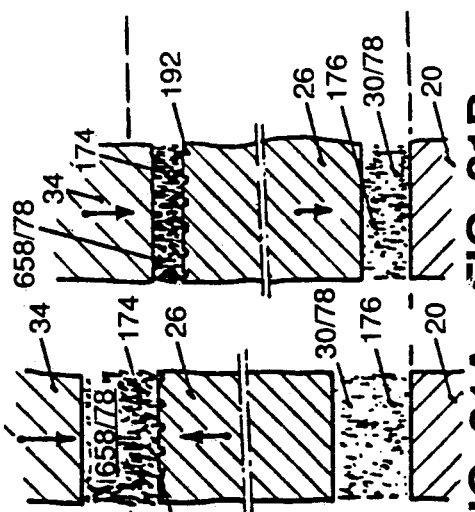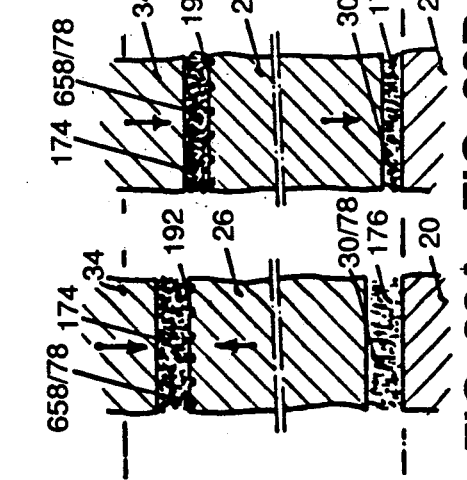

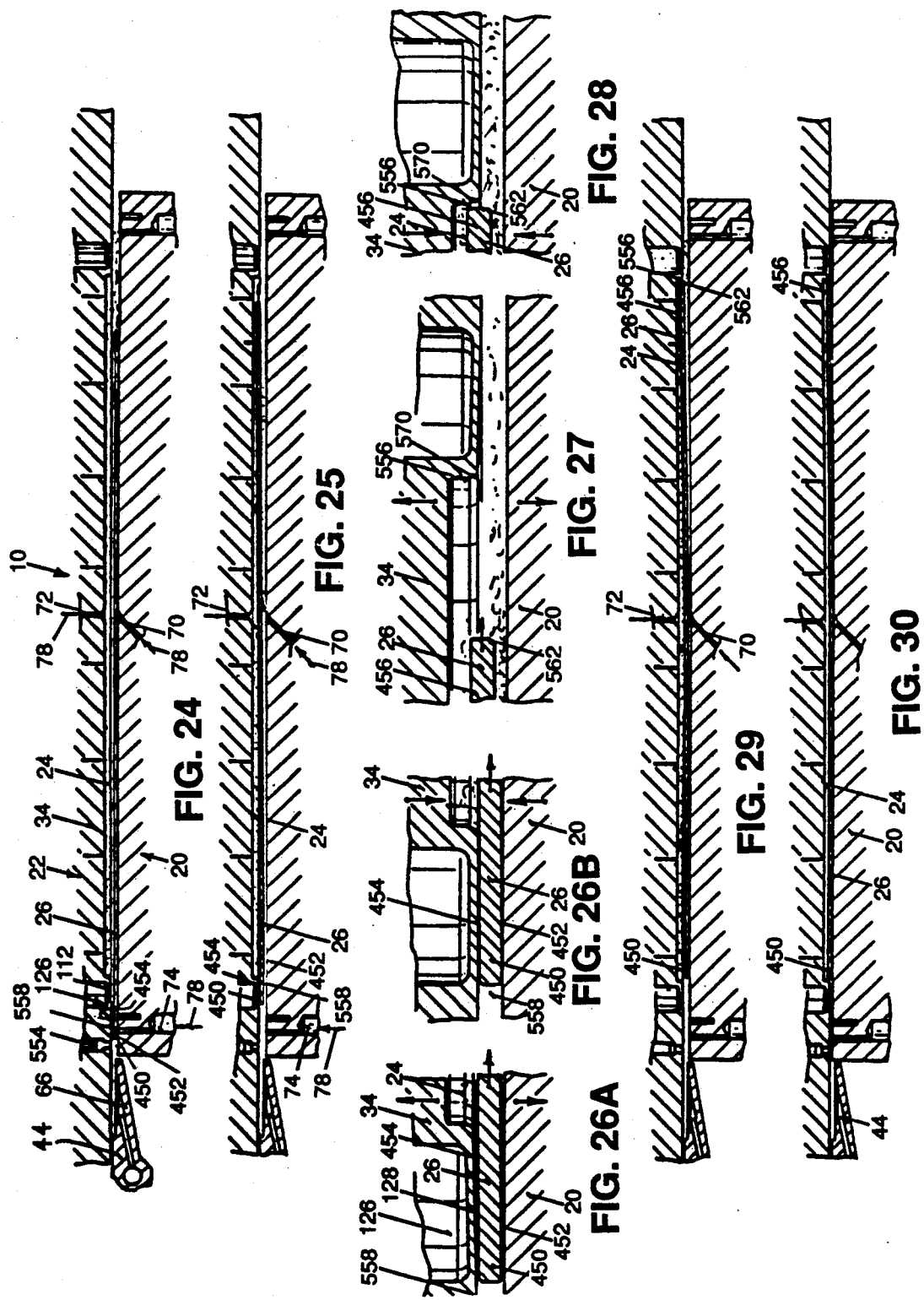

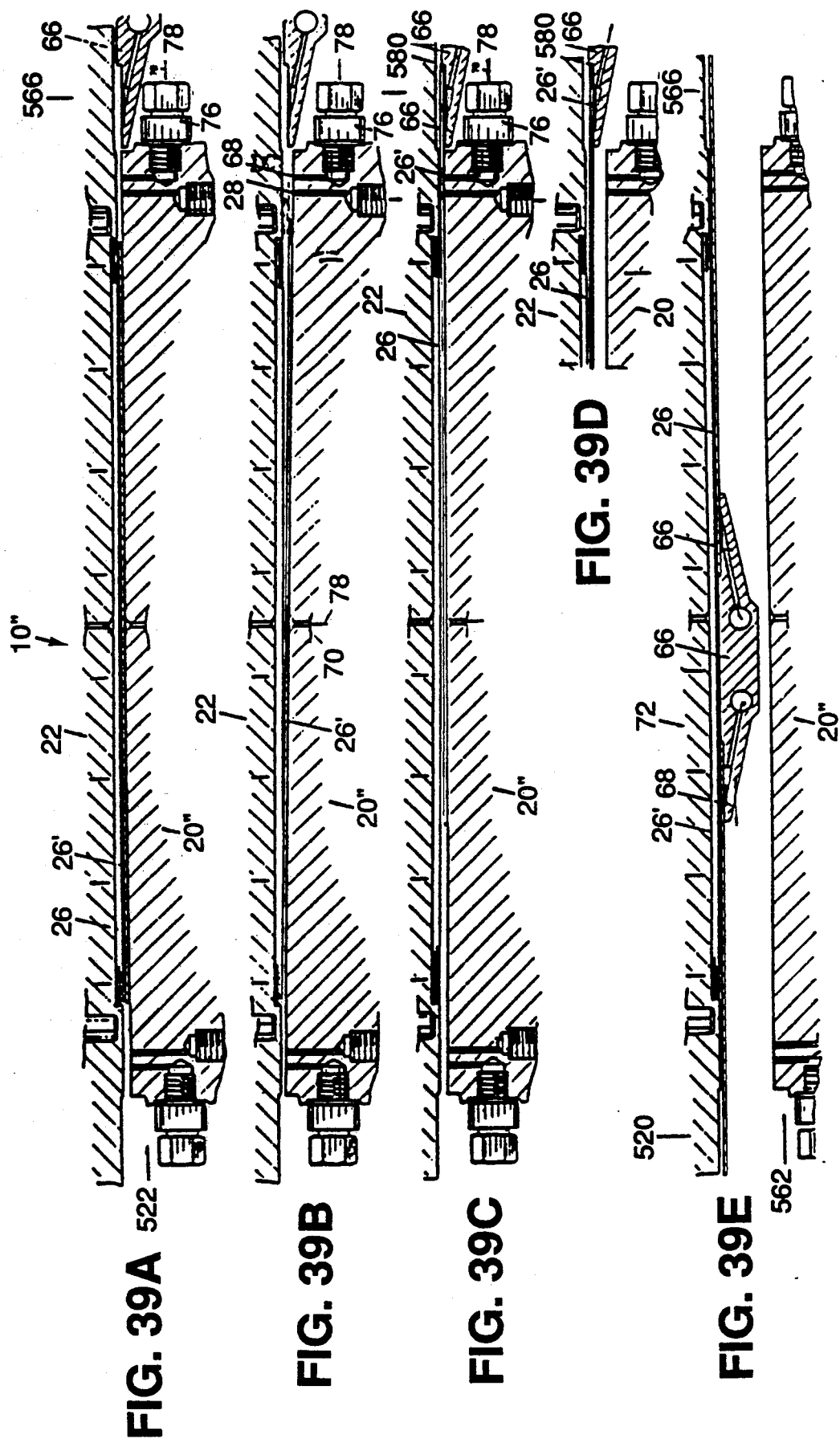

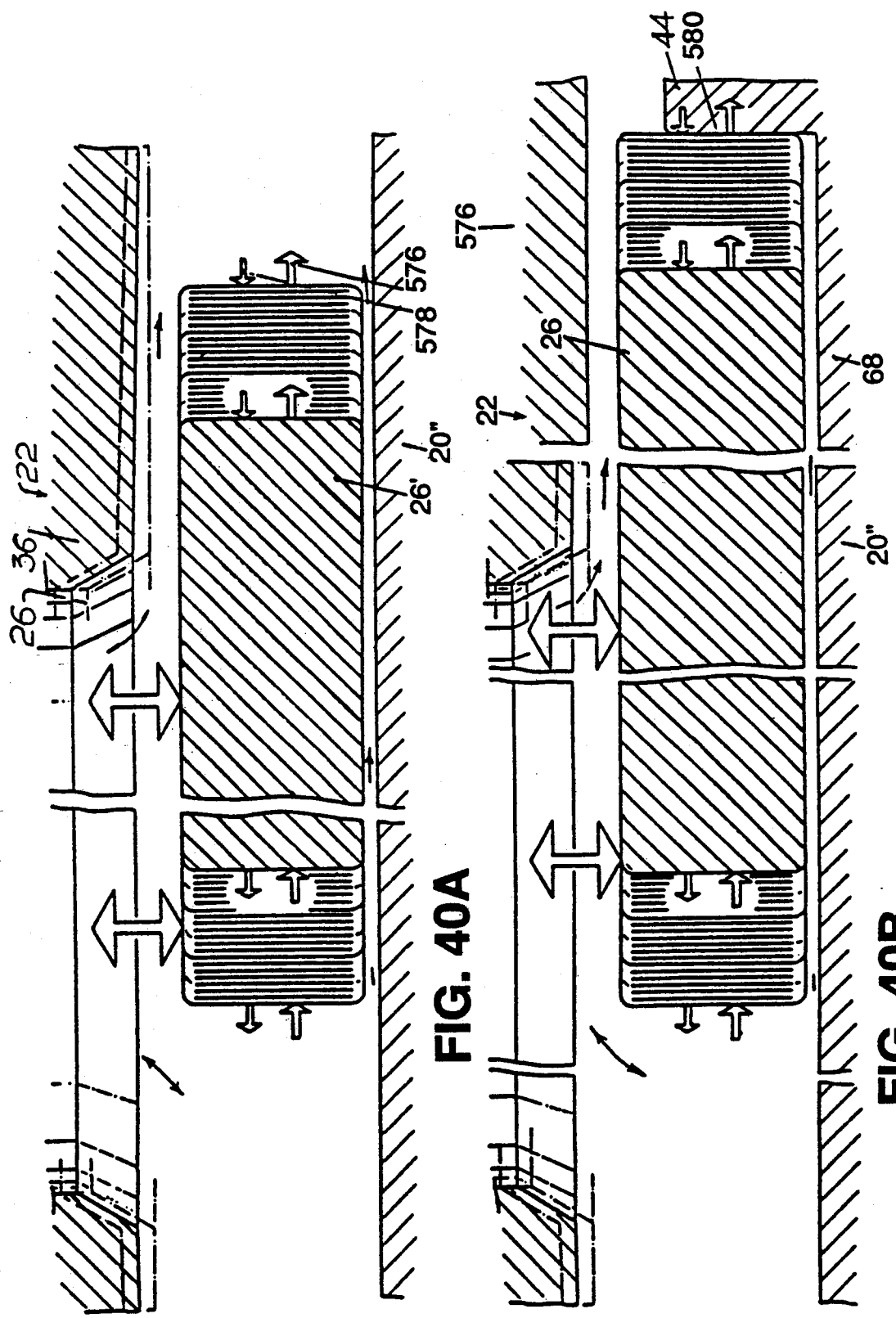

INSTALLATION FOR TRANSPORT AND PROCESSING UNDER A PULSATING DOUBLE-FLOATING CONDITION

BACKGROUND OF THE INVENTION

1. Field of the Invention

The present invention relates to apparatus and methods in the field of isolated, physically contact-free wafer processing and more specifically to a two-sided wafer processing, enabling the combination of an optimal wafer processing of one flat side of the wafer together with an accompanying removal of contamination from the other, opposite side of this wafer, as a requirement for the advanced production of wafers with feature size of 1 $\mu$m and below.

2. Description of the Prior Art

Advanced, two-sided wafer processing, taking place within a smallest sized wafer processing chamber without any mechanical moving component in this chamber provides an improved performance condition for such processing.

Such processing as well as apparatus for practicing the two-sided wafer processing are disclosed in Patent Applications Nos. NL-A-8601 254 and WO-A-87/04853 of Applicants.

In these apparatus a direct and continuous downward discharge, whether or not through a wide circumferential discharge passage, takes place of the processing medium, supplied into the processing chamber and expelled in lateral direction from both mini wafer processing gaps of the chamber on top and underneath the wafer.

Thereby the following shortcomings of these apparatus:

1. Because of the continuous discharge, the consumption of processing medium is considerable;
2. By solely moving the processing medium in lateral direction along the wafer surface, the processing efficiency is low;
3. In the central section of the processing gaps the processing efficiency is considerably higher than near the lateral outside of the wafer;
4. The required use of medium supply grooves in both upper and lower wall, extending in lateral direction from these supply channels toward close to the lateral outside of the wafer to maintain the floating condition, with locally at these grooves a reduced processing efficiency of the processing medium;
5. The use of medium supply channels in the vertical sidewall of the processing chamber for urging gaseous medium toward the wafer edge for a physically contact-free wafer processing and by means of wafer rotation a more uniform wafer processing; and
6. A relatively high consumption of gaseous medium.

SUMMARY OF THE INVENTION

It is an object of the invention to provide an apparatus and methods to eliminate these shortcomings.

Thereby a wall of the wafer processing chamber as central section of a chamber block is reciprocal over a small distance in up and downward direction under vibrating action, with during at least the wafer processing successive enlargements and narrowings of both processing gaps aside the wafer, providing during at least the main part of the wafer processing a wafer floating condition in this processing chamber, temporary at least almost sealed off, with at least almost no discharge of the processing medium toward a circumferential discharge passage, located laterally outward this processing chamber.

Furthermore, a flexible circumferential membrane section, located alongside the processing chamber, connects such central vibrating wall in lateral direction with an outer section of such chamber block and whereby at least part of the wall of such outer section functions as a sealing-off wall, extending in both horizontal and lateral direction.

Furthermore, in the upper wall of the lower chamber block a circumferential discharge passage, with at least one medium discharge channel connected therewith, is located alongside the processing chamber.

As seen from the processing chamber, this discharge passage is located in lateral direction beyond this circumferential membrane section.

In that way the sealing-off system for the processing chamber consists of at least two horizontal sealing-off sections, extending in lateral direction, with a first sealing-off section located in between the outside of this membrane section and the circumferential discharge passage for at least temporary providing a sealing off of this processing chamber during the wafer processing, and a second sealing-off section, located in lateral direction beyond this discharge passage, for sealing off the combination of processing chamber and discharge passage from the outer air during this processing.

It cannot be prevented, that during such processing processing medium is urged from this processing chamber through at least one micro leak gap toward this discharge passage.

Per high frequency vibration such discharge volume has only to amount 0.1 mm$^3$ to already create an unallowable disturbance of the uniform wafer processing.

In addition, it must be prevented, that processing contamination can enter a leak gap in between both chamber blocks in lateral direction beyond this discharge passage.

Now, in another favorable embodiment a circumferential gaseous lock compartment is located in lateral direction beyond this discharge passage.

Thereby during the wafer processing in the processing chamber in this compartment an overpressure of the gaseous medium is maintained with regard to the pressure in this processing chamber.

Furthermore, in between this discharge passage and this gaseous lock compartment a cylindrical sealing-off wall section of the upper chamber block corresponds with a sealing-off section of the lower chamber block under the creation of the second sealing off section during the wafer processing.

Furthermore, the upper wall of the lower chamber block extends in lateral direction beyond this gaseous lock compartment under the creation of a circumferential sealing-off wall section, that corresponds with a sealing-off section of the upper chamber block, providing a third circumferential sealing-off section in between both chamber clocks during the wafer processing in the sealed-off chamber.

At least during the wafer processing in this gaseous lock compartment an overpressure of the gaseous medium is maintained, that is higher than the pressure in the discharge passage.

By means of this overpressure in the gaseous lock compartment a gaseous lock is created, preventing medium to leak outward from this discharge passage.

Furthermore, this overpressure is higher than the atmospheric pressure outside the module, preventing this outer air to enter the third sealing-off section in between both chamber blocks.

During the replacement of finished-off processing medium in the processing chamber by newly supplied processing medium, with an accompanying discharge of this finished-off medium toward the discharge passage, in this passage temporary a reduced pressure and possibly even a negative pressure is maintained.

Simultaneously, near a first leak gap in the first sealing-off section a second leak gap is created in the second sealing-off section in between the gaseous lock compartment and this discharge passage, with also an urging of gaseous medium from this compartment toward this passage.

As a result, a gaseous lock is maintained, preventing processing medium to enter this second leak gap.

In addition, by means of a whirling action of this gaseous medium, urged toward the top of this narrow discharge passage, the removal is accomplished of the liquid particles and therewith of even submicron contaminants from the walls of this discharge passage.

Preferably, before the central supply of new processing medium toward the processing chamber and/or at the end of the total wafer processing, the finished-off processing medium is expelled by means of an excess of centrally supplied gaseous rinse medium, and whereby the liquid particles are atomized in this gaseous medium.

Simultaneously, an excess of gaseous medium as rinse medium is urged from the gaseous lock compartment toward this discharge passage, with an ideal removal of the finished-off, atomized processing medium from this passage downward through the discharge channels, connected therewith.

By means of the pulsating action always only in the end phase of the compression stroke, approximately 10% of the pulse time, a main expulsion takes place, providing an ideal opportunity to refill the gaseous lock compartment and to discharge the expelled medium from the discharge passage.

As a result, the dimensions of this discharge passage and this gaseous lock compartment can be extremely small, with during the wafer processing in the sealed off processing chamber a maximum available sealing-off surface, with no unallowable forces on both chamber blocks.

During the processing, with the downward displacement of the vibrating upper chamber wall, processing medium is urged from the upper processing gap in downward direction through the processing gap aside the wafer edge toward the buffer compartment underneath the membrane section.

This medium is urged against this wafer edge and at least contributes in maintaining a physically contact-free mid-position of the wafer in the processing chamber.

By means of the preferably compressible medium layer in the lower processing gap the wafer is uniformly and contact-free supported by the lower chamber block over its entire surface.

In addition, during the vertical displacements of the vibrating upper chamber wall also the wafer to a small extent is reciprocated.

Consequently, in the lower processing gap vertical flows of medium toward and from the wafer surface are accomplished.

In that way, ideally an all-sided wafer processing, such as a cleaning action, is made possible.

Furthermore, it is also possible, that in the upper processing gap a processing with an aggressive medium takes place, as for instance for etching, developing and stripping, whereas simultaneously in the lower gap the bottom side of the wafer is cleaned by means of for instance deionized water.

Instead of the supply of a combination of gaseous and liquid processing medium, it is also possible to supply a mixture of high and low boiling liquids and whereby, depending on the pressure and temperature of the bath, the quantity of vaporized medium is determined.

Furthermore, only gaseous or vapor phase medium can be used.

It is of great importance to limit the amplitude of the vibrations of the chamber wall as much as possible, because of:

1. to prevent too great thrusts on the teflon lining of the lower chamber block;
2. to restrict the maximum thrusts of the medium in the lower processing gap in downward direction onto the lower chamber block to avoid the creation of a leak gap, with the leaking away of the processing medium from the chamber; and
3. to avoid unallowable vibrations of the module itself.

Furthermore, for the optimal use of the vibration energy for in particular the urging of processing medium toward and from the wafer, it is desirable, that the vibrating wall is as close as possible to the wafer.

Such also in view of:

1. a maximum pressurized filling of both processing gaps; and
2. a considerably reduced time for the processing, required, also because of the possible high frequency of the vibrations.

Consequently, in a following favorable embodiment this apparatus contains means for displacing the vibrating chamber wall over a distance, that is greater than that of the vibration amplitude.

Thereby, after the pressurized filling of the processing chamber and the following sealing off of this chamber, by means of the lower chamber block a subsequent compression of at least the gaseous medium within this chamber is accomplished by means of a downward displacement of this vibrating upper chamber wall.

For that purpose, this apparatus is provided with a pulsator chamber as thrust compartment for such independent displacement of this vibrating upper chamber wall in vertical direction.

Thereby this pulsator chamber is connected with a supply and discharge line for medium and by means of regulating the pressure of the medium in this chamber the height of this chamber is changeable, providing successive vertical positions of the upper chamber wall.

Furthermore, the pressure of the medium in this pulsator chamber at least jointly determines the average pressure of the processing medium in the processing chamber, wanted.

Furthermore, by means of the medium in this pulsator chamber, during the wafer processing in the processing chamber automatically a parallel setting of the upper chamber wall with regard to the lower chamber wall is established.

Furthermore, in between the top of the pulsator and the module housing a damper is located for an at least jointly damping of the vibrations of this pulsator.

Furthermore, that for that purpose the medium in this pulsator chamber is a gaseous medium.

Furthermore, this apparatus is configured that way, that the pulsator chamber also functions as physical pulsator, whereby successive supplies and discharges of medium reciprocably displace this central section of the upper chamber block.

Furthermore, that thereby the frequency and amplitude modulation for the vibrations of the upper chamber wall consists of low, medium and high frequent vibrations, with respectively large, medium and small amplitudes and a possible variation thereof.

Furthermore, that as an electric pulsator is used, its lower section is integrated with this upper chamber wall.

Due to this independent downward displacement of the vibrating upper chamber wall immediately above the wafer, the already pressurized medium in the upper and lower processing gap is brought to a still higher average pressure, with consequently an increased action thereof on the wafer.

By means of this pressurized filling the difference in downward thrust of the processing medium in the lower processing gap and the upward thrust of the thrust medium in the thrust chamber, located underneath the processing chamber, are greatly reduced, avoiding an unallowable deformation thrust at the seal sections for this processing chamber.

During the wafer processing, in the extremely narrow processing gaps aside the wafer the supply of medium therein for replacement of the foregoing finished-off processing medium is not wall possible, because of the then required high supply pressure and velocity of the medium at the central orifices, with at these orifices a distribution of the uniform wafer processing.

By using this pressurized filling, a continuous central medium supply under high pressure is not required.

Furthermore, by means of an increased pressure of the medium in the pulsator chamber the vibrating chamber wall is displaced further downward, with a resulting expulsion of processing medium from both processing gaps.

Thereby, by means of the increased pressure of the medium in the processing chamber, the lower chamber block is at least locally moved downward, with an established discharge of processing medium from the chamber.

Such downward displacement of the lower chamber block can be supported by a simultaneous reduction of the upward thrust of the medium in the thrust chamber underneath this lower chamber block.

The medium, expelled from the processing gaps, is urged through the relatively wide circumferential chamber compartment aside the wafer edge toward such local discharge gap.

Subsequently, the reciprocating upper chamber wall is brought to a higher position for the central supply of replacement medium.

Thereby, by means of a reduction of the pressure of the medium in the thrust chamber, at least the first part of the supplied medium as rinse medium is expelled from these processing gaps.

After such filling of the processing gaps with new medium, this upper chamber wall again is brought toward its lower wafer processing position for a following, similar wafer processing.

For removal of the submicron contamination from the submicron valleys in the wafer topography it is desirable, that in at least the upper processing gap a maximum cleaning action takes place on the wafer by means of maximum differences in pressure of the processing medium.

For that purpose, during the processing the average height of the upper processing gap is kept that small, that the outer section of the wafer as seal wall seals off this gap to such extent, that in this gap in almost individual processing takes place.

Thereby, by means of a central supply of medium toward the lower gap, the average height of the upper processing gap is kept smaller than that of the lower gap during such maximum processing.

In this way, in combination with the lagging effect of the wafer, considerably greater differences in pressure take place in the upper processing gap than in the lower processing gap, without affecting the lower chamber block.

In addition, by means of this lagging effect of the wafer, such difference in pressure in the upper processing gap during the compression stroke of the upper chamber wall is established in less than half of the total compression time.

The pressurized filling of the processing chamber now also enables the use of at least almost solely liquid processing medium for the upper processing gap.

In a following favorable method, during the upward expansion stroke of the upper chamber wall this wall is drawn upward that fast, that the wafer, due to its mass, remains behind, with the creation of even submicron vacuum bubbles in the exploding liquid medium, also within the submicron valleys of the wafer upper side.

Furthermore, during the compression stroke the liquid medium under a high velocity is urged toward the wafer, at first still moving upward, with by means of an imploding action a hefty affecting of the boundary layer immediately above the wafer.

As a result, this micro boundary layer is dissolved and an expulsion of medium, including eventual contamination, takes place from the wafer valleys.

Consequently, in case of wafer cleaning, a very aggressive cleaning action of the upper processing side of the wafer occurs.

The total volume of the processing mediums in both processing gaps is very restricted and amounts only 0.5 to 1 $cm^3$ for a 6" wafer.

As for the wafer processing a replacement of this processing medium takes place only a few times, the total consumption of medium and in particular of liquid medium is extremely low, which is of great importance in case of explosive, poisonous and highly aggressive liquids.

Thereby the use of liquid thrust medium in the thrust chamber underneath the lower chamber block enables the required vertical positions of this block as part of the wafer supply- and discharge system toward and from the processing chamber and the wafer processing.

Due to the established spreading of the mixture of processing mediums in lateral and radial direction by means of the repeated compressing and expanding actions of both processing gaps, in the upper and lower wall of the processing chamber no medium supply grooves, extending from the central orifices in lateral direction, are required.

In addition, the whether or not flat orienting side of the wafer has no negative effect on the double-floating condition and the contact-free wafer position in lateral direction and no additional thrust medium has to be urged toward the wafer to obtain a uniform wafer processing by means of wafer rotation.

In addition, the apparatus contains means for displacing a wafer, to be processed, from a robotic wafer sender under floating condition toward an at least almost centric position thereof with regard to the processing chamber.

In a following favorable embodiment the vertical sidewall of the processing chamber is used as wafer stop for in the end phase of the wafer displacement over the lower chamber block the establishing of this at least almost centric position.

Furthermore, that in at least the end phase of the wafer displacement toward this chamber the upper chamber wall vibrates for slowing down the wafer velocity by means of established flows of medium in vertical direction toward and from the wafer.

Further favorable characteristics of the apparatus follow from the description of the Figures.

BRIEF DESCRIPTION OF THE DRAWINGS

FIG. 4 is an enlarged sectional view of the processing chamber with its sealing-off structure and whereby the lower chamber block together with the wafer has arrived in its end phase of upward displacement and this wafer is brought into a double-floating condition.

FIG. 5 is the sectional view according to FIG. 4 in a sealed off condition of the processing chamber.

FIGS. $5^A$ through $6^D$ show much enlarged a section of the processing chamber, whereby by means of at least gaseous medium wafer processing takes place, with an upward displacement of the upper chamber wall during the expansion stroke in successive phases thereof.

FIGS. $7^A$ through $7^D$ show the chamber according to the FIGS. $6^A$ through $6^D$ during the compression stroke of this upper chamber wall in successive phases thereof.

FIGS. $8^A$ through $8^C$ show very much enlarged a section of the chamber and the successive phases of the processing according to FIGS. $6^A$ through $6^C$.

FIGS. $9^A$ through $9^C$ show very much enlarged a section of the chamber and the successive processing phases according to the FIGS. $7^A$ through $7^C$.

FIGS. $10^A$ through $10^E$ show the processing chamber according to FIG. $8^C$, with during the processing a continued downward displacement of the upper chamber wall during its upward expansion stroke.

FIGS. $11^A$ through $11^E$ show the processing chamber according to FIGS. $10^A$ through $10^E$ during the compression stroke of this upper chamber wall.

FIGS. $12^A$ through $12^E$ show for the chamber according to FIG. $11^E$ successive phases of the expansion stroke of this upper chamber wall.

FIGS. $13^A$ through $13^E$ show for the chamber according to FIGS. $12^A$ through $12^E$ successive phases of the compression stroke of the upper chamber wall.

Figure 1:
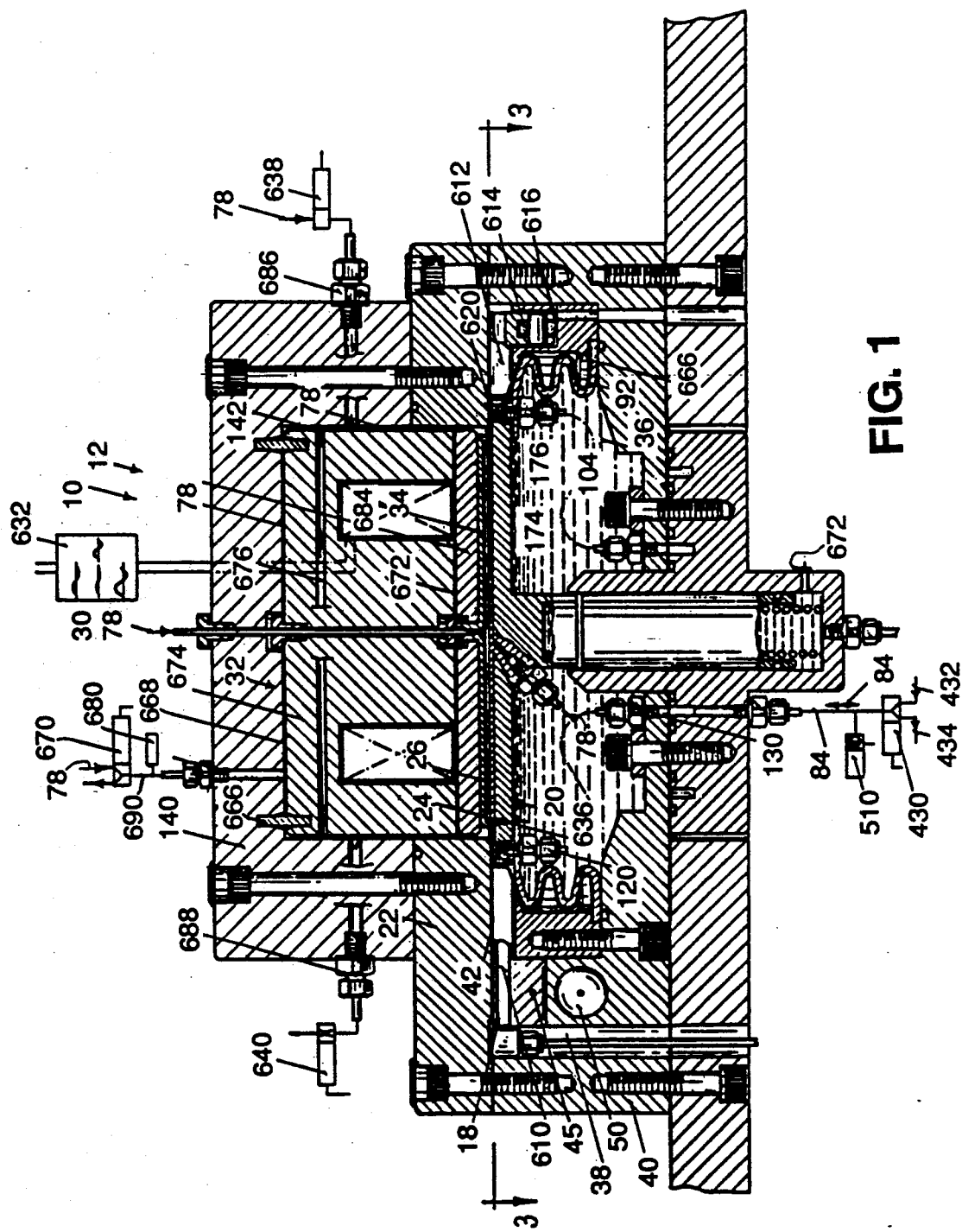
FIG. 1 is a transverse sectional view of the wafer transfer and processing apparatus according to the invention and wherein an electromagnet pulsator is used.

FIGS. $14^A$ and $14^B$ show the pressurized filling of the upper wafer processing gap of the apparatus according to FIG. 1 with liquid medium.

FIGS. $15^A$ through $15^C$ show the wafer processing of the apparatus according to the FIGS. $14^A$ and $14^B$, with successive downward positions of the upper chamber wall during its compression stroke.

FIGS. $16^A$ through $16^C$ show the successive wafer processings of the apparatus according to the FIGS. $15^A$ through $15^C$ during the compression stroke of this wall.

FIGS. $17^A$ through $17^C$ show the pressurized filling of the upper processing gap of the apparatus according to FIG. 1 with the combination of liquid and gaseous processing medium.

FIG. $18^A$ shows much enlarged the upper processing gap at the processing side of the wafer, with the urging of the liquid medium toward the wafer, as is indicated in the FIG. $15^C$.

FIG. $18^B$ shows the gap section according to FIG. $18^A$, with the urging of liquid medium from the wafer.

FIG. $19^A$ shows the gap section according to FIG. $18^A$, with the urging of the combination of gaseous and liquid medium toward the wafer.

FIG. $19^B$ shows the gap section according to FIG. $18^A$, with the withdrawal of the combination of gaseous and liquid medium from the wafer boundary layer.

FIGS. $20^A$ and $20^B$ show much enlarged a section of the processing chamber according to FIG. $17^C$ in the start and end phase of the compression stroke of the upper chamber wall in a downward pressurized filling position thereof.

FIGS. $21^A$ and $21^B$ show the processing chamber according to FIGS. $20^A$ and $20^B$ in an upward pressurized filling position thereof.

Figure 22:
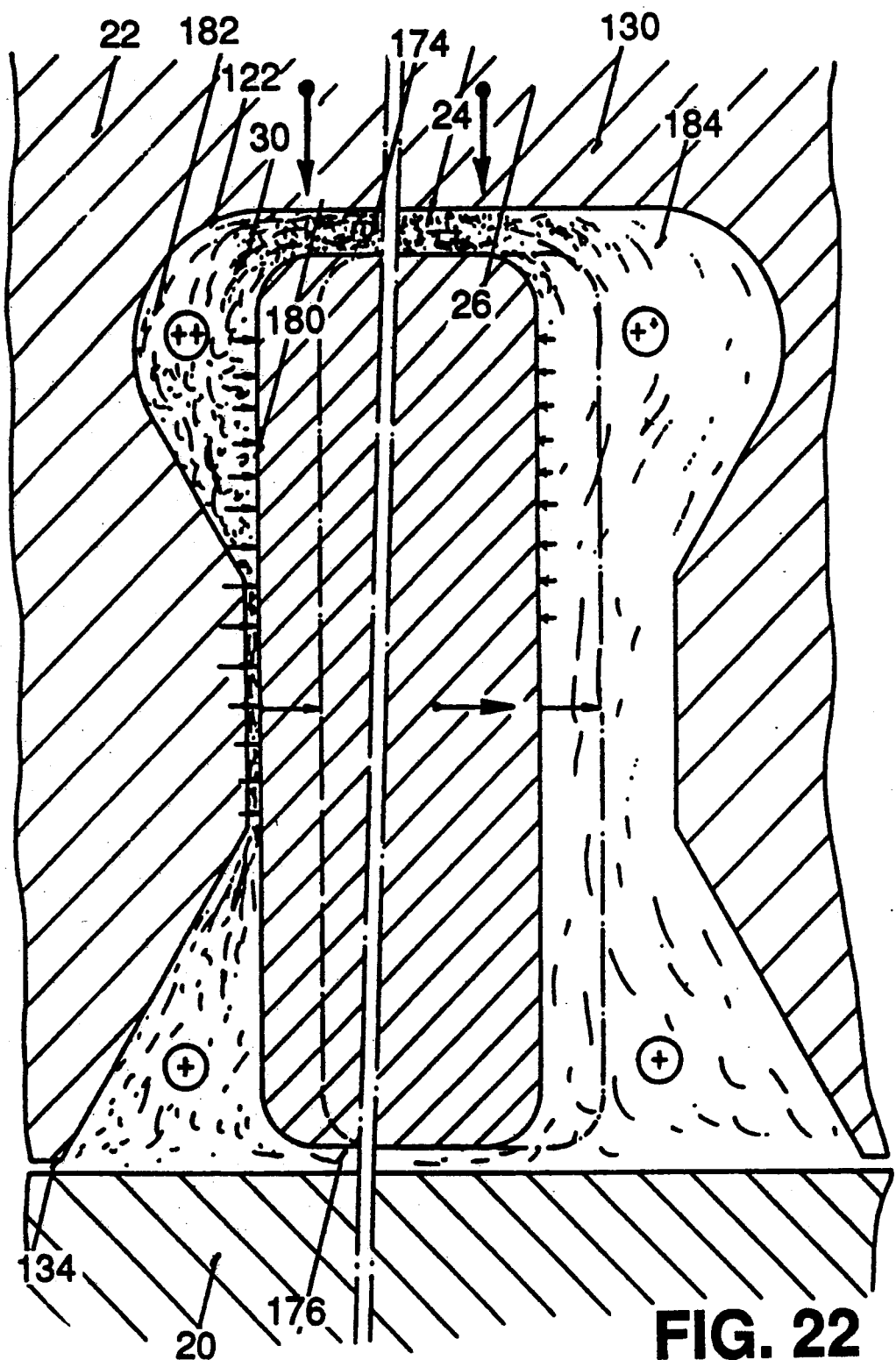

FIG. 22 is a much enlarged detail of the processing chamber during the wafer processing, with therein by means of the pulsating processing medium the urging of the excentrically positioned wafer toward a centric position thereof during the downward displacement of the upper chamber wall.

Figure 23:
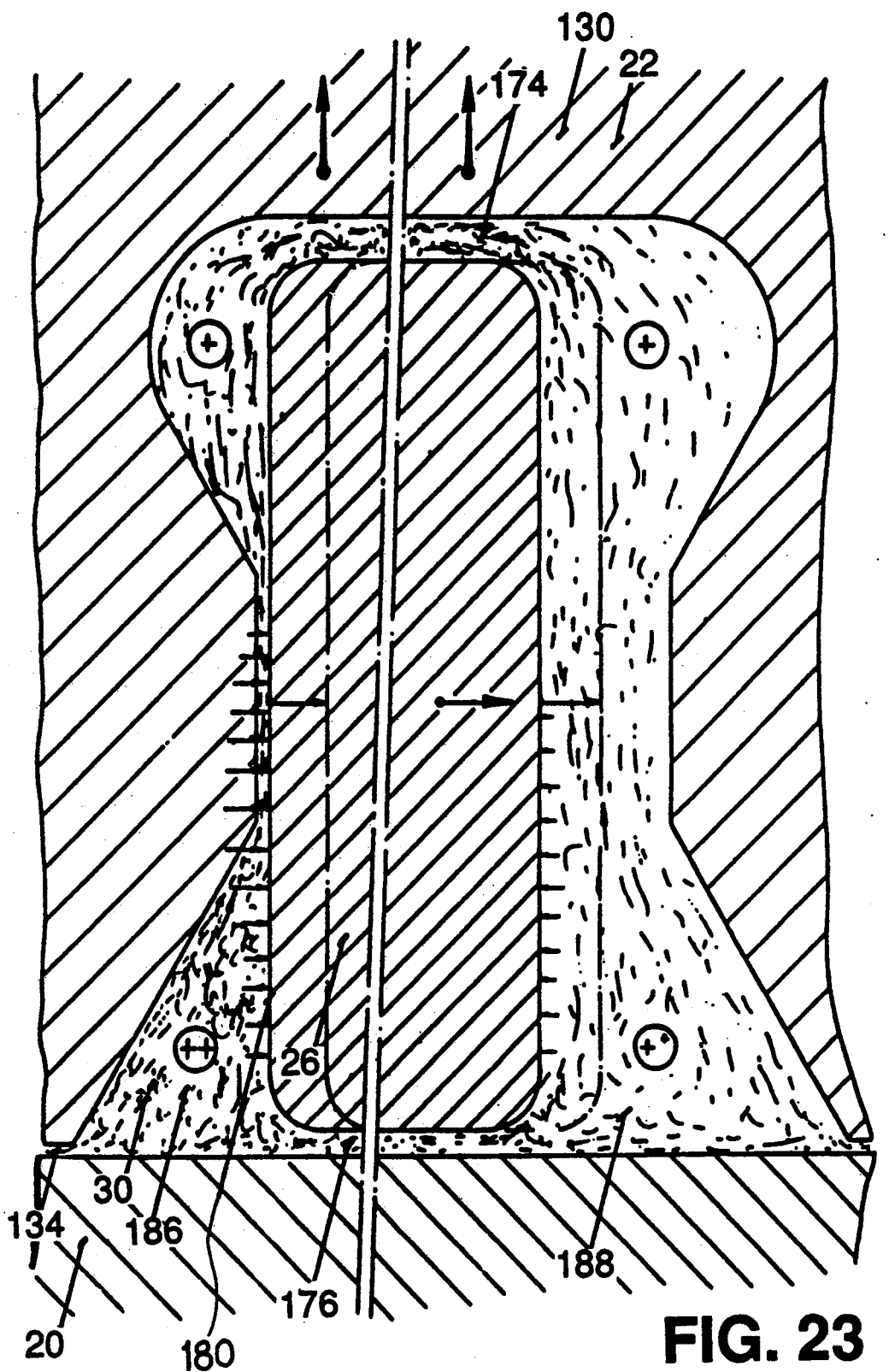

FIG. 23 shows the detail according to FIG. 22, with by means of the processing medium the urging of the excentrically positioned wafer toward a centric position thereof during the upward displacement of the upper chamber wall.

FIG. 24 is an enlarged detail of the processing chamber of the apparatus according to FIG. 1, with wafer supply from a transfer arm.

FIG. 25 is the detail according to FIG. 24 and whereby the front end of the wafer is swiveled upward by means of the gaseous cushion.

FIGS. $26^A$ and $26^B$ show much enlarged the supply passage toward the processing chamber at the membrane section, with therein the back end of the wafer still present during the upward expansion stroke of the downward compression stroke of the upper chamber wall.

FIG. 27 shows much enlarged the front end of the processing chamber, with therein the upward displacement of the front end of the wafer.

FIG. 28 shows the front end of the chamber according to FIG. 27, with the upwardly displaced wafer front end near the vertical side wall of the chamber as wafer stop.

FIG. 29 is the detail according to FIG. 24, with therein the established wafer stop within the processing chamber.

FIG. 30 is the detail according to FIG. 29, with the ending of the floating condition for the wafer for the downward displacement of the combination of block and wafer to its lowest transfer position.

Figure 31:
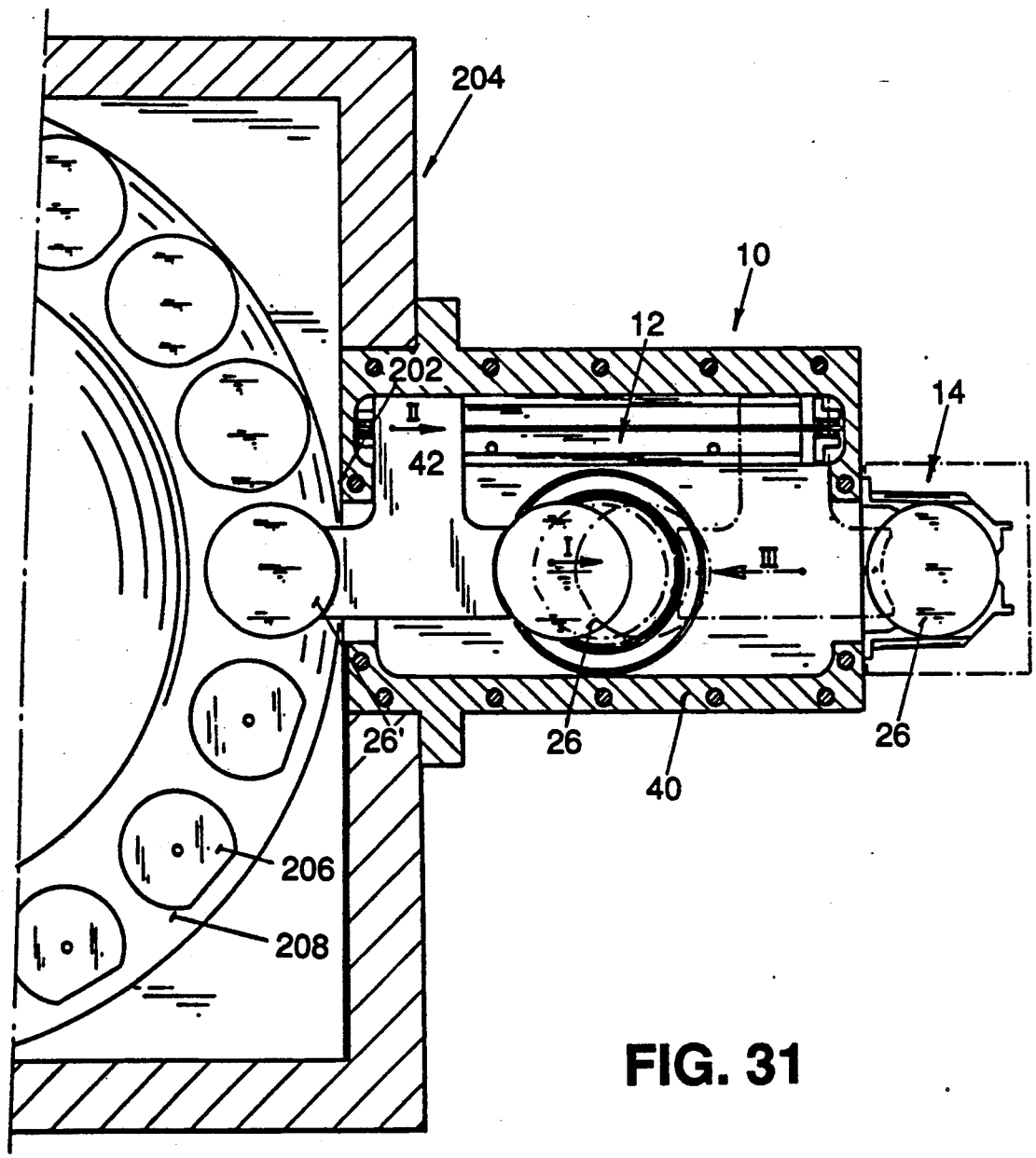
Figure 32:
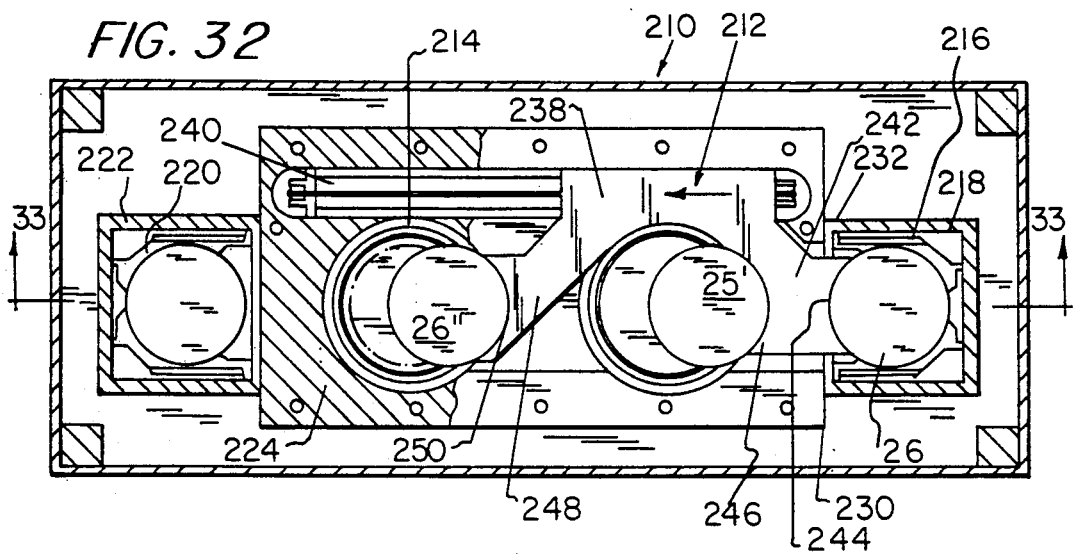
Figure 33:
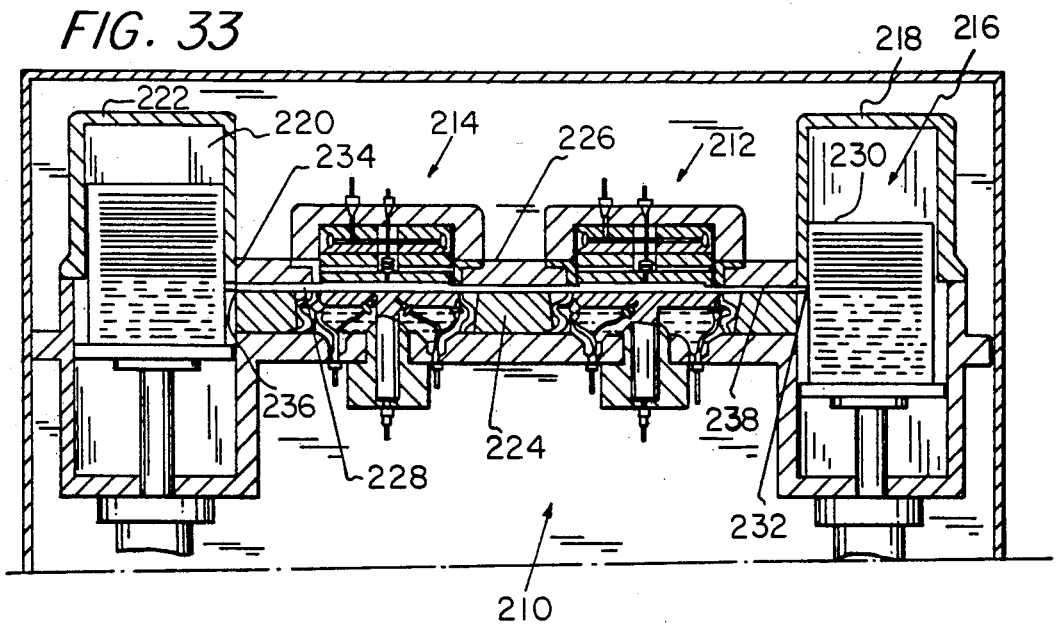
Figure 34A:
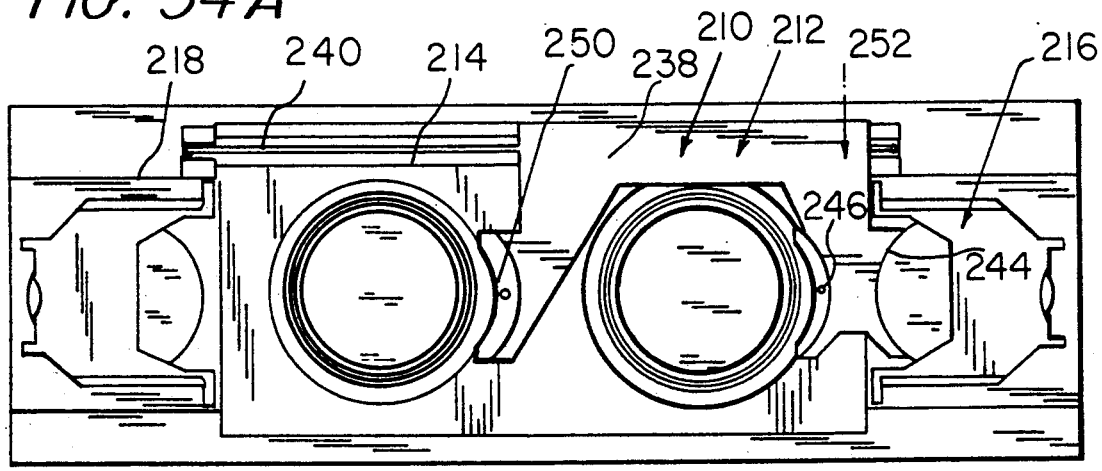
Figure 34B:
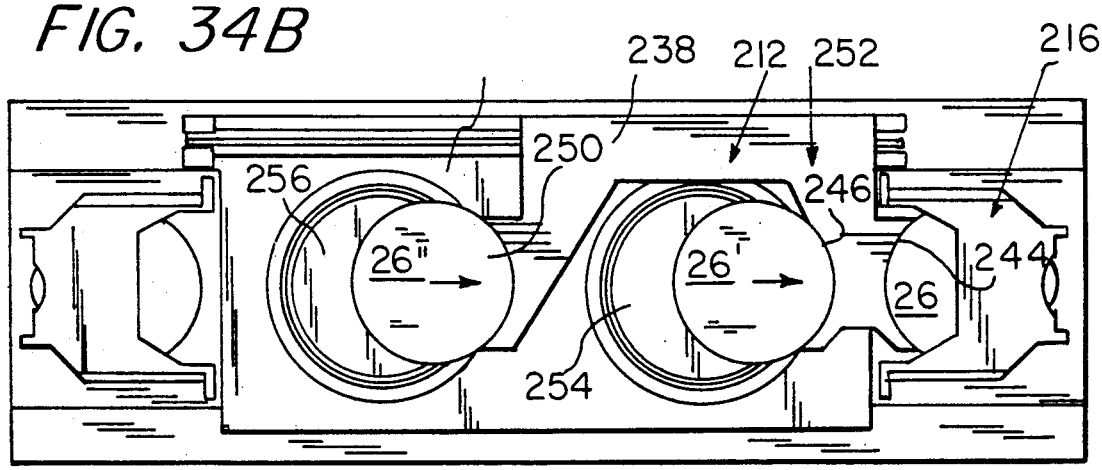
Figure 34C:
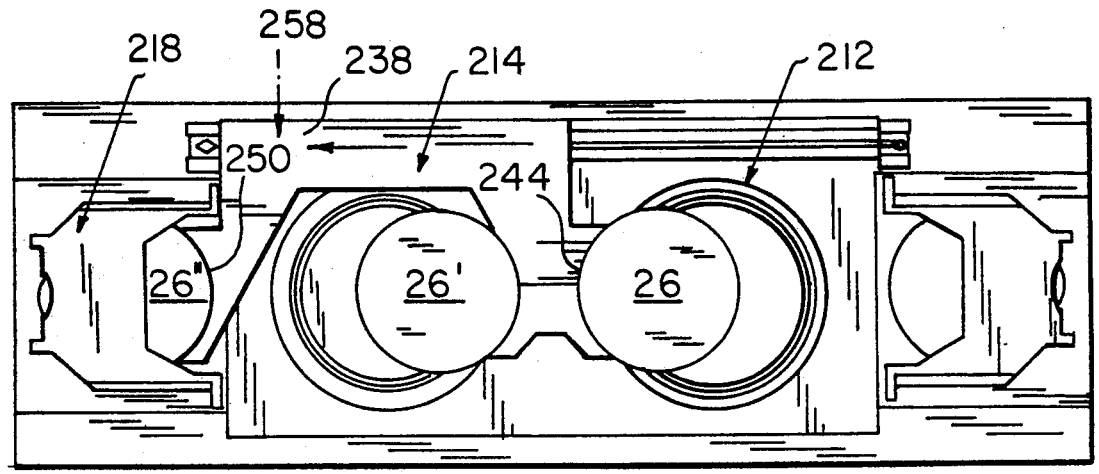
Figure 34D:
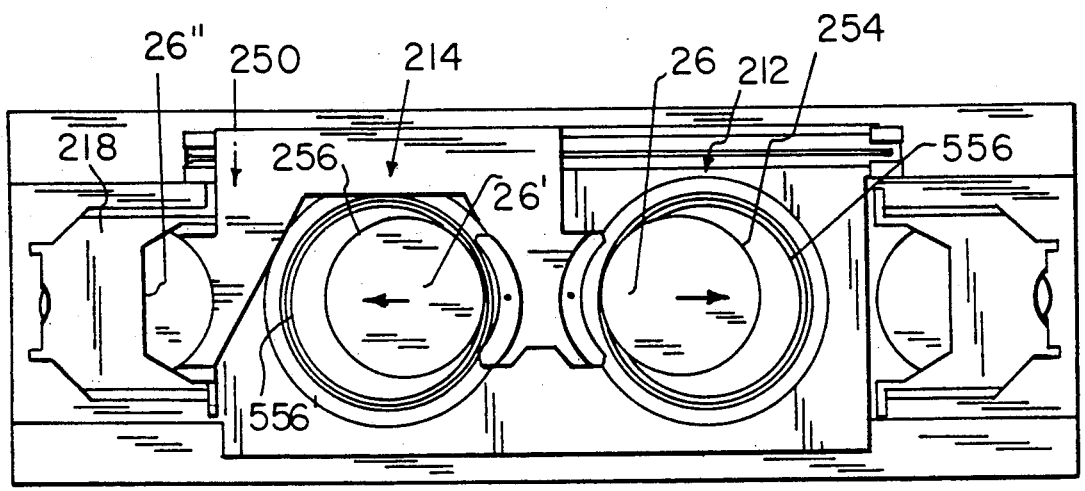
Figure 34E:
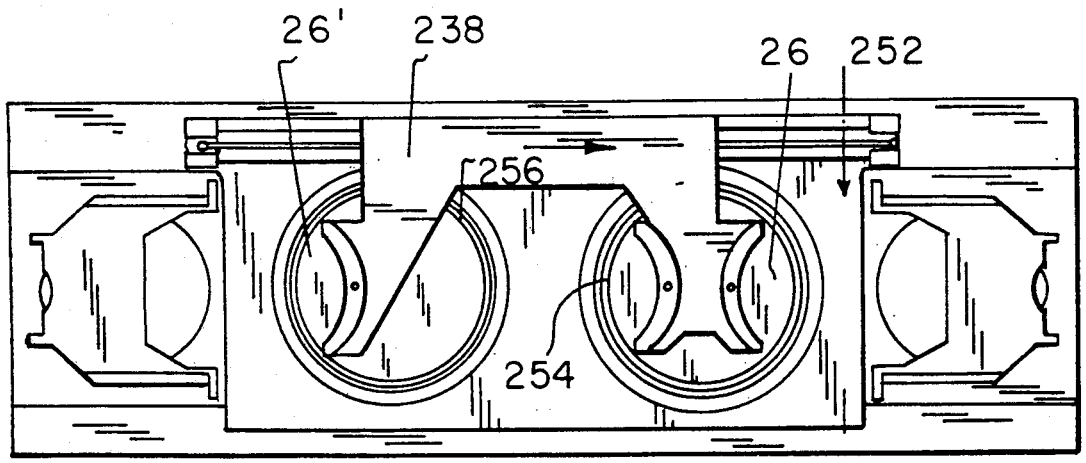
Figure 35:
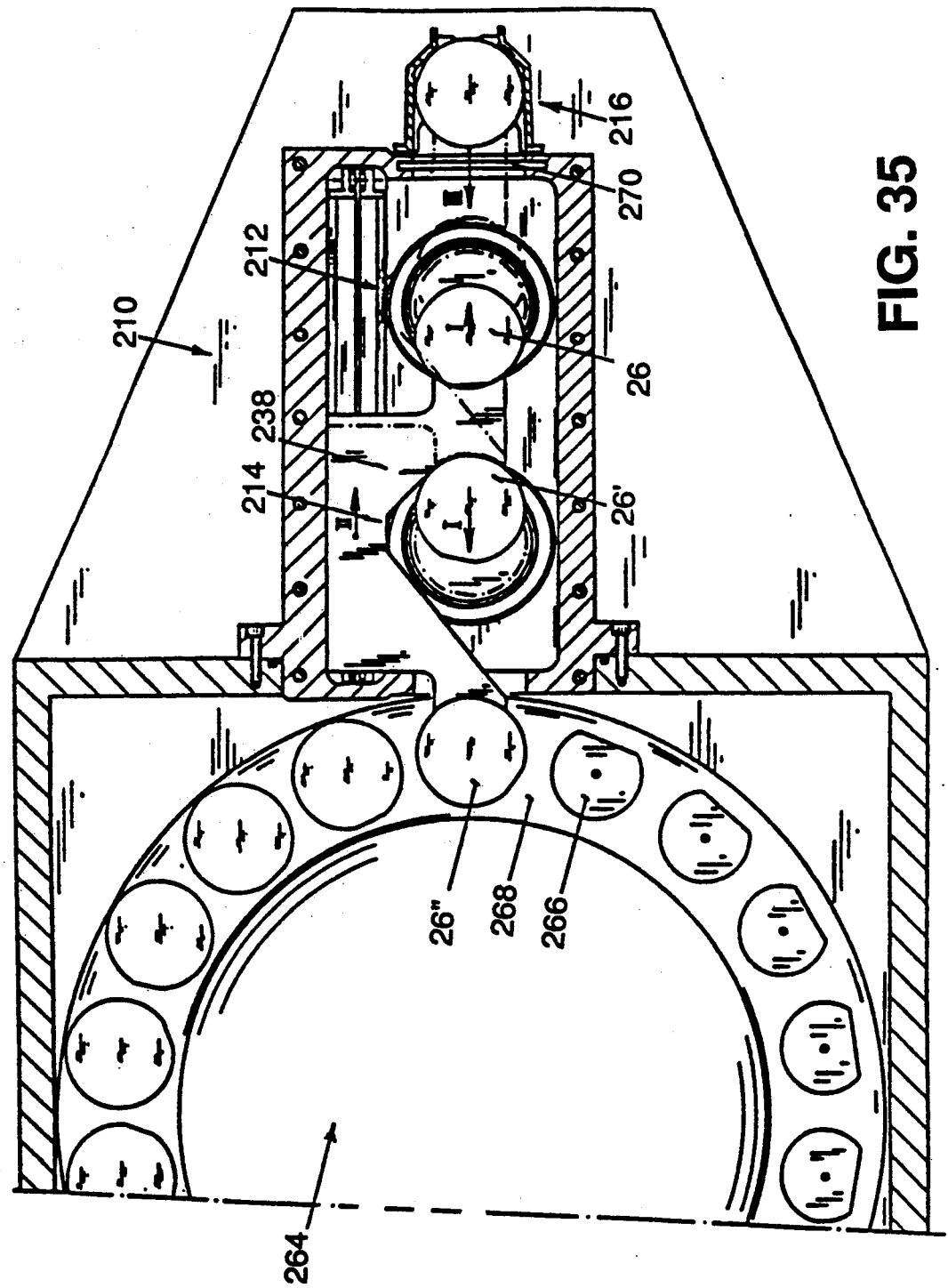
Figure 36:
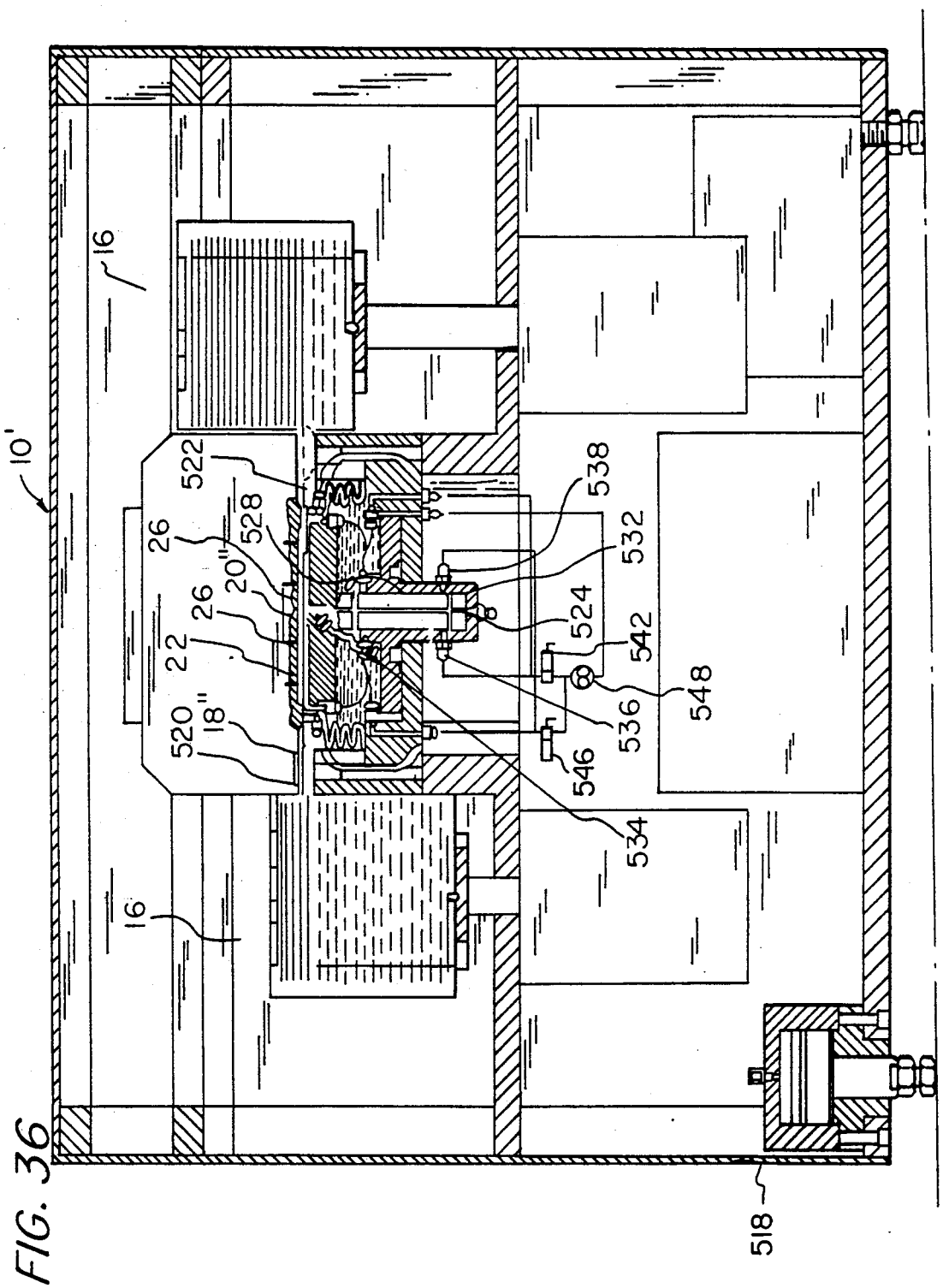
Figures 37A, 37B, 37C, 37D, 37E:
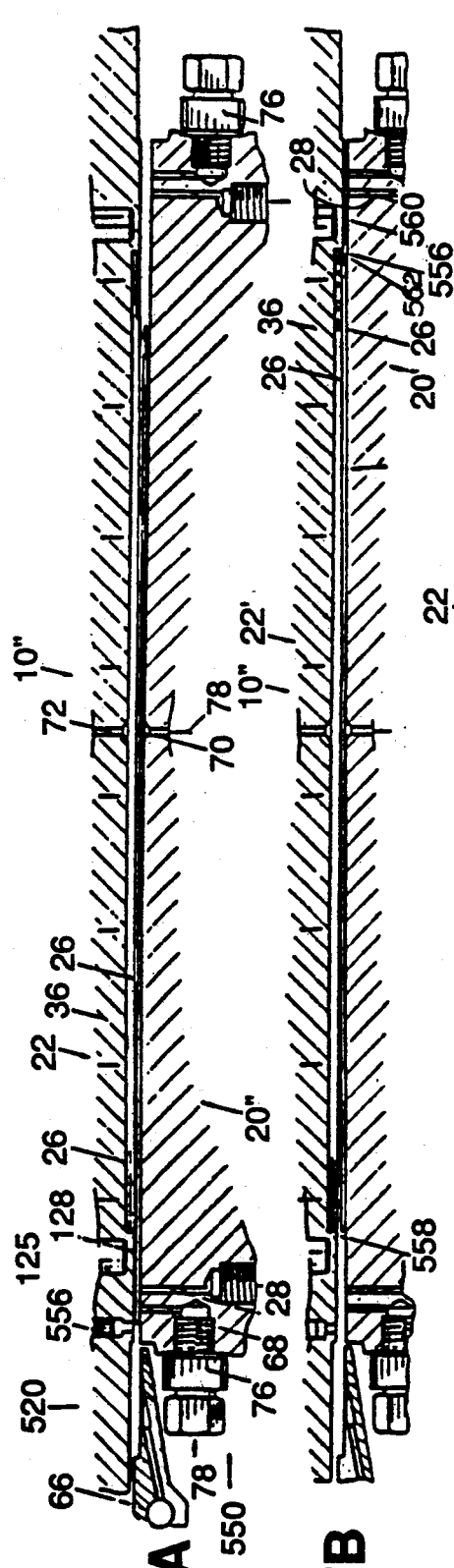
Figure 38A:
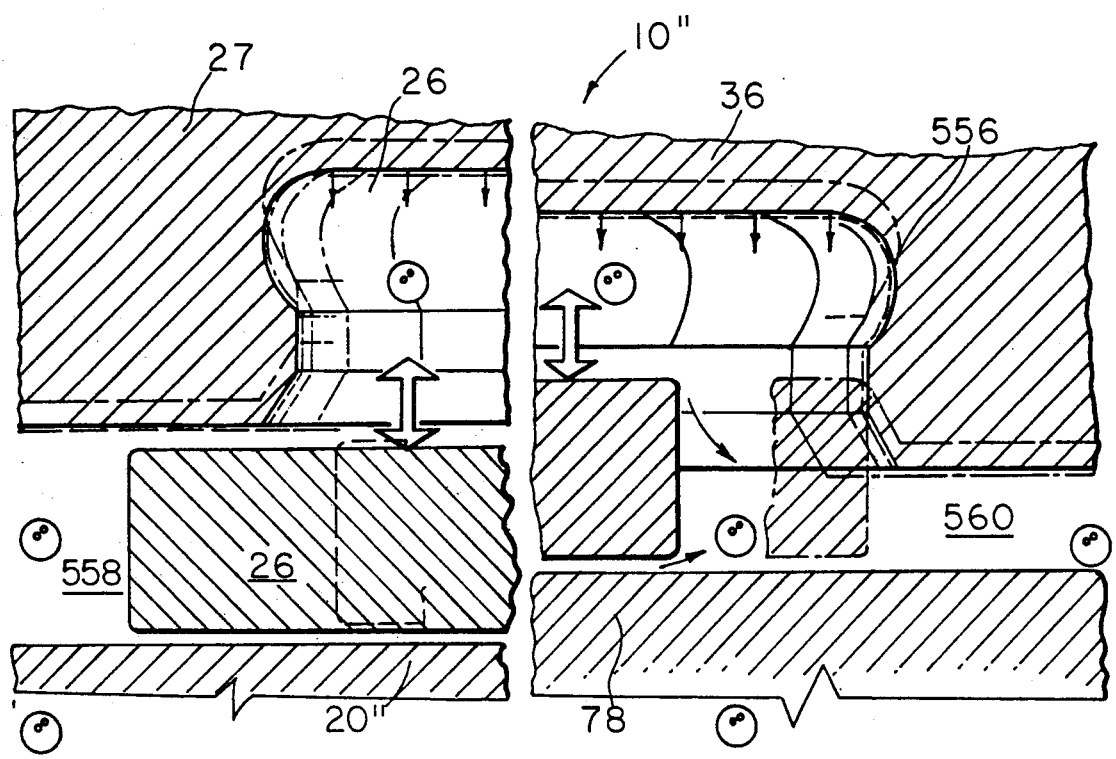
Figure 38B:
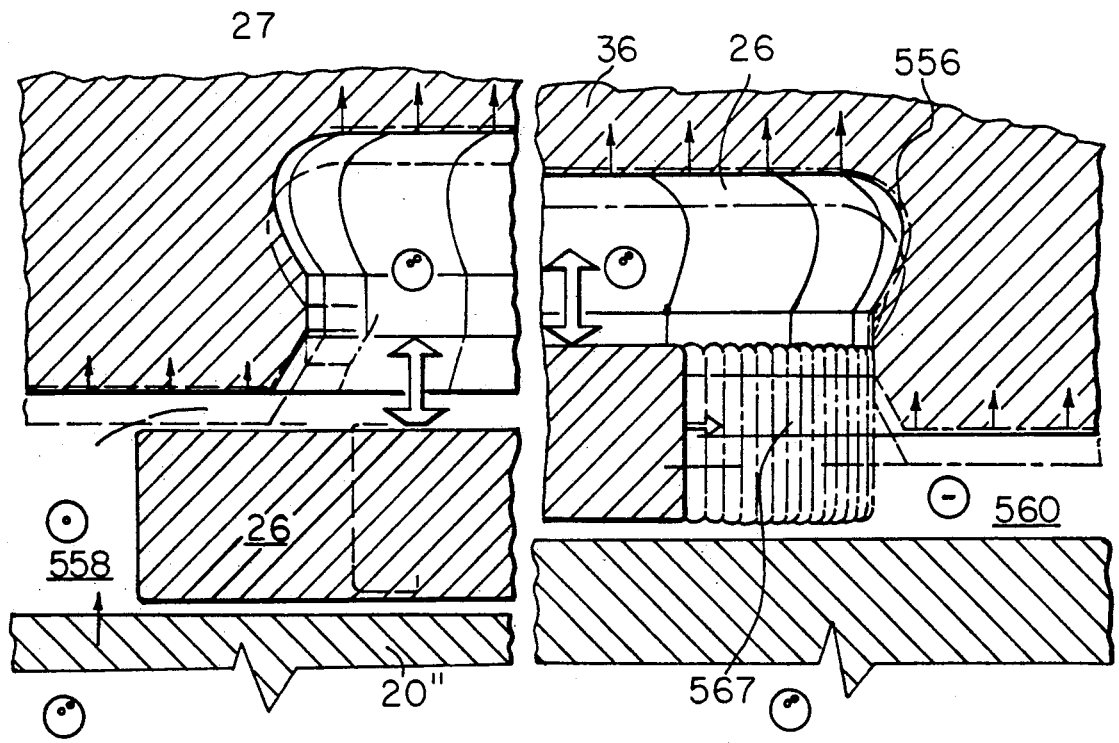

FIG. 31 is the apparatus according to FIG. 1 in adapted form located at the entrance of a main wafer processing module.

DESCRIPTION OF THE PREFERRED EMBODIMENTS

Figure 2:
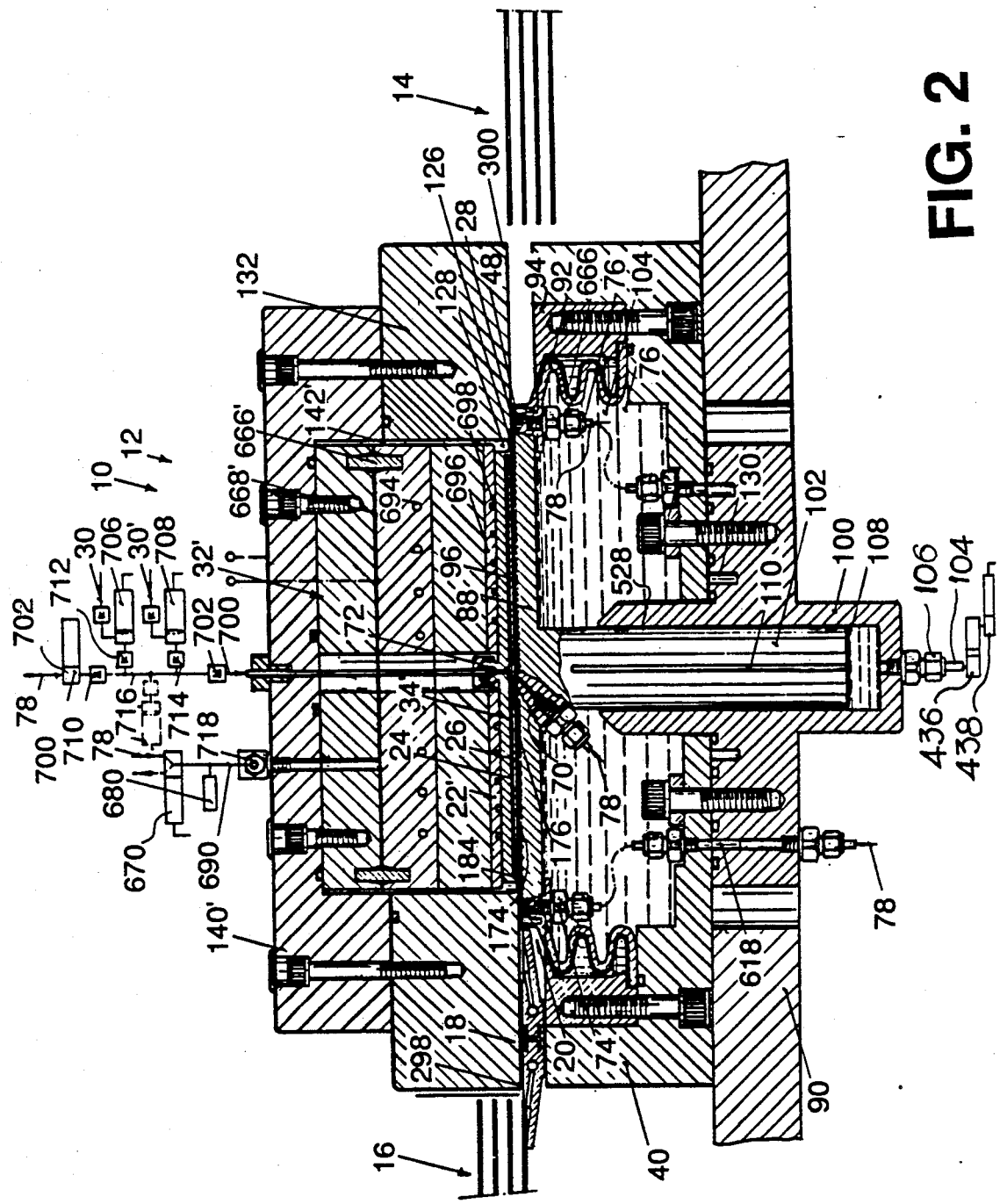
FIG. 2 is the apparatus according to FIG. 1, with therein the location of a piezo pulsator.
Figure 3:
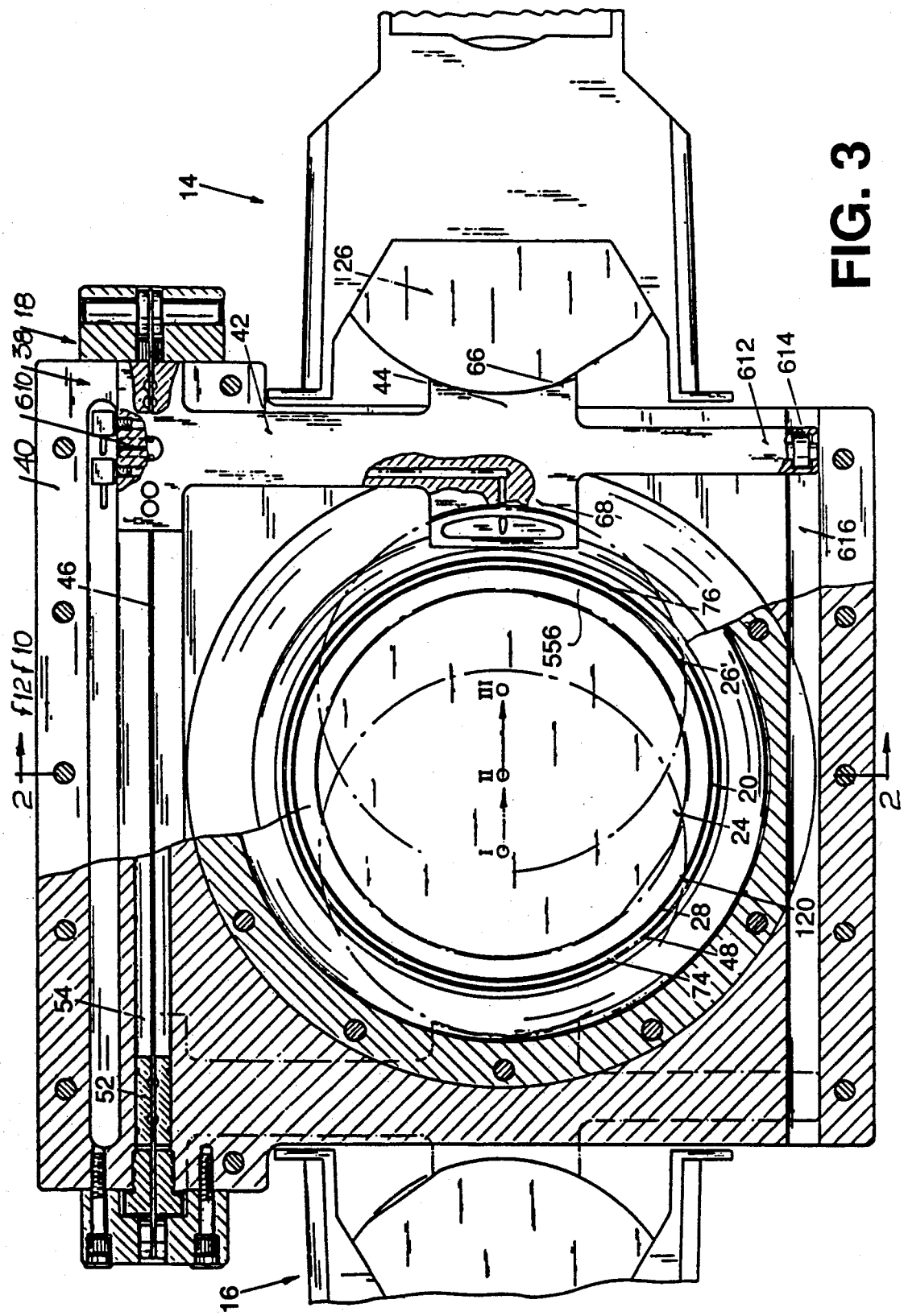
FIG. 3 is a sectional view over the line 3—3 of the apparatus according to FIG. 1.

FIGS. 1, 2 and 3 the wafer processing apparatus 10 is shown, consisting mainly of processing module 12, sender cassette 14, receiver cassette 16 and the wafer transfer unit 18.

The processing module mainly consists of the lower chamber block 20, upper chamber block 22, processing chamber 24 in between for processing of the wafer 26, the circumferential discharge passage 28 for discharge of the processing medium 30, the gaseous lock compartment 48 alongside this passage 28, the pulsator 32 for the reciprocation of the central section 34 of the upper chamber block in up- and downward direction, and the thrust chamber 36 for an up- and downward displacement of this lower chamber block.

The wafer transfer unit 18 for horizontal wafer transfer consists of the displacer 38, located in the support block 40, transfer arm 42 with the wafer hold block 44, chord 46 and two rolls for coupling this transfer arm with the piston 52, displaceable within the recess 54 of the support block 40.

The arm 42 is made of PFA and is reinforced with the metallic support 610. In addition, this arm with its extension 612 extends beyond block section 44 and whereby in this extension the roll unit 614 is located.

Thereby during the wafer transfer this roll-unit is displaced over the guide track 616 of the block 40, providing the correct take-over and transfer positions of the block 44 in vertical direction.

By means of vacuum thrust a wafer 26 from the sender cassette is suctioned onto the receiver section 66 of the block 44 for transfer thereof toward the processing module 12, whereas simultaneously a wafer 26' from the processing chamber 24 by means of a vacuum thrust is suctioned onto the wafer discharge section 68 of this block for transfer thereof toward the receiver cassette 16.

In the lower chamber block the central supply channel 70 for processing medium 30 is located, whereas in the upper chamber block 22 also the supply channel 72 for whether or not processing medium 30 or gaseous medium 78 or for both mediums is located.

Furthermore, the supply lines 74 and 76 are connected with the gaseous lock compartment 48 for supply of gaseous medium 78.

These lines are connected with two compartments 618, located in the seal block 90.

The lower chamber block 20 consists of the flexible bellow section 92 and the central section 88, whereby for this block and the upper chamber block 22 preferably teflon PFA, to a sufficient extent resistant to the processing medium, at least as a lining is used.

Thereby the lower end of the bellow section 92 is airtight mounted onto the support block 40, whereas the central section 88 contains the non deformable metal core 96.

The enclosure ring 94 thereby provides both an air tight connection and an enclosure in lateral direction of this bellow section 92.

During the wafer processing, with an accompanying increased pressure of the processing medium 30 in the chamber 24 and of the thrust medium 104 in the thrust chamber 36, this ring encloses this bellow section in upward direction.

The discharge passage 28 is through a number of lines 120 connected with the common discharge compartment 130, located in the seal block 90.

This block 90, with its extension 100, provides a guidance for the extension 102 of the lower chamber block 20.

The thrust medium 104 is periodically supplied through the central supply channel 106 into thrust compartment 108, and from there through grooves 110 into chamber 36.

Consequently, the total column of thrust medium 104 over the entire circumference of the lower chamber block 20 is available for its urging against the upper chamber block 22.

In the upper chamber block alongside the central recess as processing chamber 24 the circumferential recess 126 is located, with underneath the membrane section 128.

As a result, the central block section 34 to a small extent is reciprocably displaceable with regard to the outer section 132.

The PFA lining 622 as part of the central block section 34 also extends in lateral direction toward the lateral outside of this section 132 as wafer transfer- and sealing-off wall and so uninterruptedly from the entrance side 298 toward the exit side 300 of the module 12.

Within the scope of the invention this lining can also consist of any other suitable material.

By means of a great number of mini dovetailed grooves 630 the PFA lining of the lower chamber block 20 is anchored onto the non deformable section 96.

The fabrication of this block takes place by means of a press-process, whereby the non deformable sections are brought in and subsequently the lining under high pressure and temperature is molded and anchored, whereafter a machining of this lining takes place toward its final shape.

Within the scope of the invention any other manufacturing of the block, such as the appliance of the teflon onto the upper chamber block 22 by means of a spray process, and whether or not in addition, is possible.

Also because of the small width of both discharge passage 28 and gaseous lock compartment 38, the contact surface between both chamber blocks 20 and 22 is relatively large.

In addition, the central section of the lower chamber block 20 over almost its entire surface is carried ty the non deformable section 96.

Consequently, the established difference in pressure between the thrust medium 104 in the chamber 36 and the processing medium 30 in the processing chamber 24 is spread over this contact surface, with no unallowable deformation of the thin walled teflon lining.

The PFA seal- and bellow section 88/92 of the lower chamber block 20 is reinforced with a woven layer of stretch resistant material.

In FIG. 1 the electro-magnet pulsator 32 by means of the circumferential buffer block 666 and in between glue-connections is anchored against the bottom side of the upper cap 140, with the creation of a sealed-off thrust compartment 668.

Through nipple 682 this compartment 668 is connected with the supply line 690 for gaseous medium 70 and whereby in this line the regulator valve is located.

By means of regulating the supply and discharge of the gaseous medium 78 an adjustment of the pressurized filling of this compartment with this medium 78 is accomplished.

By adjusting the pressure of this medium the height of this compartment can be set from a minimum, preferably smaller than 0.1 mm, toward a maximum, larger than 0.2 mm.

In this way the position in vertical direction of the stator 674 of the electro-magnet pulsator 32 is adjustable and consequently the position of the upper chamber block section 34, which by means of a glue connection is secured to the yoke 684 of this pulsator.

In between this stator and the yoke the mini gap 672 is located.

By means of a supply of gaseous medium 78 toward this thrust compartment 668 the whether or not vibrating block section 34 as upper chamber wall is lowered, to establish the pressurized filling with processing medium of the sealed off processing chamber.

Thereby the gaseous medium 78 within this compartment in combination with the buffer block 666 also functions for damping the vibrations from this pulsator toward the module housing 40/132.

The gaseous medium 78 in the pulsator chamber 142 has a pressure, that approximately corresponds with the pressure within the thrust compartment 668.

The average pressure in the extremely narrow gap 672 in between the stator 674 and the yoke 684 approximately corresponds with the pressure of the medium 78 within the thrust compartment 668 and immediately follows any change of this pressure.

The height of this gap 672 depends on the electric energy with regard to the difference between the positive and negative part of the alternating current, supplied by the modulator 632.

Thereby during the processing the height of this gap is approximately two times greater than the amplitude of this vibration.

In this way jointly by means of the pressurized medium 78 within this mini gap a pressurized filling of the processing chamber with medium 30 is made possible.

The medium 78 in the pulsator chamber 142 also functions as coolant for this pulsator and whereby by means of regulator valve 640 in the discharge line 688 the velocity of this medium, flowing through this chamber, is adjustable.

For that purpose, in the stator 674 this cooling channels 676 are located.

By means of the medium 78 within the thrust compartment 668 and the chamber 142 and in particular within the cap 672, in combination with the reciprocation of the central block section 34 as upper chamber wall, this upper wall over its entire wafer surface is uniformly displaced downward, with over this wafer surface an at least approximately the same height of each of the processing gaps 174 and 176, see also FIG. 5, as a requirement for a uniform processing of such wafer.

During the wafer processing in the sealed off processing chamber, with the establishment of a certain average processing pressure within this chamber, by means of sensor 636 impulses are forwarded toward the regulator valve 436 in the supply line for the thrust chamber 36 for maintaining a sufficient high sealing-off pressure of the thrust medium 104 in this chamber.

Expulsion of processing medium 30 from the chamber 24 takes place by means of a continued supply of medium toward the thrust compartment 668, with consequently a downward displacement of the pulsator 32 and therewith of the upper chamber wall 34, with an established additional pressure increase of the processing medium 30 in this processing chamber.

Beyond a certain pressure in this chamber 24 at least locally a leak gap in between the blocks 20 and 22 is created, with a resultant expulsion of processing medium therethrough toward the discharge passage 28.

Thereby, due to a continued downward displacement of the upper chamber wall 34, at the end an almost total expulsion of the processing medium from the processing chamber is established and for that purpose at least in the end phase of such downward displacement of this upper wall preferably the amplitude of the vibrations is reduced.

Furthermore, it is also possible, that such expulsion of processing medium at least jointly takes place by means of an enlargement of the height of the mini gap 672 in between the stator and the yoke by a continued enlargement of the positive part of the alternating current.

In FIG. 2 the piezo pulsator 32' by means of the flexible sleeve 666' is enclosed within the pulsator chamber 142', with in between the mounting block 692.

Thereby the creation of the sealed-off thrust compartment 668'.

Here too, by adjusting the pressure of the medium 78 for this compartment by means of valve 670, the height of this compartment is adjustable upward from a minimum.

Consequently, through this piezo pulsator the vertical position of the block 34 varies.

The pulsator chamber 142' is connected with a not indicated supply and discharge line for gaseous coolant 78. Thereby in this piezo pulsator the cooling channels 694 are positioned.

Furthermore, the block section 34' is glued against the lower plate 696 of this pulsator, with in between the channels 698 for the coolant.

Here also, the at least jointly damping of the vibrations of this pulsator by means of the gaseous medium 78 within the compartment 668', and the by means of this medium accomplished vertical setting of the upper chamber wall 34 on a uniform distance toward the lower chamber block 20 for a uniform wafer processing.

Such precise setting is essential, because the vibration amplitudes of the piezo pulsator are minimal, for instance only 5 μm, with a frequency of 40,000 Herz.

Furthermore, because for an effective wafer processing the upper processing gap 174 often must have a minimum height of less than 15 μm.

Furthermore, in a following favorable method of wafer processing and damping of the vibrations toward the module housing for both pulsators 32 and 32' a combination of at least two vibrations take place.

These series of vibrations, including low frequency vibrations, are accomplished by changing the positive and negative parts of the alternating current at a low frequency, for instance 1,000 Herz.

The medium sized frequency and amplitude of these vibrations are adjustable, whereby this second vibration functions as carrier vibration for the high frequency vibrations, super-imposed thereon, providing modulated vibrations for frequency and amplitude.

In FIG. 2 the supply line 700 for processing medium 30/78 is shown.

This module functions as an all-sided wafer cleaner, whereby such cleaning takes place under a pulsating double-floating condition.

Thereby, due to the small amount of medium, required for the upper processing gap, the inside diameter of this supply line is minimal, less than 0.2 mm, so that this line to a sufficient extent is capillary to contain liquid medium 30.

Such also by means of the check-valve 702, located in this supply line immediately above the entrance 72.

Supply of gaseous medium 78 through valve 704 into this supply line enables the pressurized filling of the processing chamber and the replacement of finished-off medium 30.

Subsequently, after such established pressurized filling, by means of the membrane pump 706 at least jointly a first medium 30 is urged into this supply line.

Thereby a relatively very limited supply, only approximately 10 mm$^3$ per second.

This medium 30, urged through the orifice 72 into the upper processing gap 174, thereby gradually expels the gaseous medium 78 from this cap in lateral direction toward the buffer compartment 184 aside the wafer edge.

During such injection of liquid medium 30, by means of the regulator valve 670 gaseous medium 78 is urged toward and from the thrust compartment 668', with and established additional vibration of the upper chamber wall at a low frequency, approximately 20 Herz and with a great amplitude, approximately 30 $\mu$m.

Due to the accomplished additional pressure increase in at least this upper gap 174, medium is expelled therefrom and gathered in the buffer compartment 184.

Beyond a maximum pressure of the medium in this compartment 184, which is determined by the upward thrust of the thrust medium 164 in the thrust chamber 36, the lower chamber block 20 at least locally is urged downward over a micro distance and whereby medium from this buffer compartment through a than created leak gap is urged toward the discharge passage 28.

By means of such modulated vibration such discharge takes place repeatedly.

After some time, an at least total filling of this upper gap 174 with this liquid medium 30 has taken place, resulting in the in FIGS. 15 and 16 shown medium flows and the entering of the buffer compartment 184 by this medium.

Medium 30 is also urged from this buffer compartment into the lower processing gap 176, with a mixing thereof with the gaseous medium 78, already present therein.

For replacement of this liquid medium, subsequently through both central orifices 70 and 72 a supply of gaseous medium 78 into both gaps takes place, with a gradual urging therefrom jointly by means of a whether or not temporary reduction of the pressure of the medium 104 in the thrust chamber 36.

Thereby already at a lower pressure of the medium in the processing chamber a downward displacement of the lower chamber block is accomplished under the creation of a circumferential discharge gap.

After such expulsion of the medium 30, by means of the membrane pump 708 less aggressive liquid medium 30', as for instance de-ionized water, is injected into this supply line 700 and consequently through the orifice 72 into the upper processing gap 174.

The check-valves 710 and 712 thereby prevent the urging of this medium through the line section 716 in the direction of the supply 702 for the gaseous medium 78 and the supply 706 for the liquid medium 30.

Within the scope of the invention directly liquid medium 30' can be supplied into this gap for replacing the liquid medium 30. Such instead of the supply of gaseous expulsion medium 78 into the upper gap 174.

In FIGS. 6 and 7 the processing chamber 24 is much enlarged and in FIGS. 8 and 9 very much enlarged shown in detail.

Thereby the central block section 34 vibrates under a high frequency, 5,000 Herz, with a small vibration amplitude, approximately 20 $\mu$m.

In FIGS. $6^A$ and $7^A$, with a by means of the lower chamber block 20 accomplished sealing-off of the processing chamber 24, the upper chamber wall 34 by means of supply of medium into the thrust compartment 668 and the pulsator chamber 142 is moved downward from its upper wafer transfer position, see also FIGS. $8^A$ and $9^B$.

In FIGS. $6^B$ and $7^B$, see also FIGS. $8^B$ and $9^B$, such pressurized filling of the processing chamber toward the wanted level has taken place.

In FIGS. $7^B$ and $9^B$ thereby the compression stroke, and in FIGS. $6^B$ and $8^B$ the expansion stroke of this upper chamber wall 34 is taking place.

During this compression stroke, in the upper gap 174 highly pressurized processing medium 30 is urged toward the processing side 190 of the wafer 26, with simultaneously by means of the established downward displacement of this wafer an urging of medium 30 in the lower gap 176 toward the lower side 664 of this wafer.

Thereby, also due to the lagging effect of the wafer in the start phase of the compression stroke, by means of the still upward displacing of this wafer within a short time a considerable increase of the pressure in the upper gap 174 takes place, see FIGS. $20^A$ and $21^A$, with a resulting very hefty action of the processing medium on the wafer topography 190.

Furthermore, due to this lagging effect of the wafer in the start phase of the expansion stroke, with the still continued downward displacement of the wafer, within a short period of time a considerable decrease in pressure is taking place in the upper gap 174, with a resulting escape of medium from the micro boundary layer immediately above the wafer, see also FIG. $19^B$.

Due to the minimum height of both processing gaps 174 and 176 during the processing, less than 50 $\mu$m, in combination with the high vibration frequency, during the compression stroke the expulsion of processing medium form these gaps toward the compartment 184 aside the wafer edge and the buffer compartment 134 is very limited and takes place almost exclusively from the outer gap sections 652 and 654, as shown in FIG. $7^B$.

During the expansion stroke medium under overpressure is urged form the buffer compartments 134 and 184 back into these gap sections 652 and 654, as is shown in FIG. $6^B$.

In FIGS. $6^C$ and $7^C$, and much enlarged in FIGS. $8^C$ and $9^C$, the upper chamber wall 34 is moved further downward, with an increased compression of the pressurized filling in both gaps 174 and 176.

Thereby a still heftier action of the vertical flows of medium 30 on the wafer surfaces 190 and 664 is taking place, with an entering of even the submicron valleys 192.

After the processing has taken place for a certain period of time, the upper chamber wall 34 is moved further downward, with due to the further diminution of both processing gaps, an increased pressure of the processing medium.

Consequently, at last the lower chamber block 20, its upper wall being parallel with this upper chamber wall 34, is urged downward under the creation of a circumferential discharge passage in between this lower chamber block and the upper chamber block 22, and by means of the high frequency vibrations of the upper chamber wall a highly variable discharge of processing medium from the buffer compartment 184 through this discharge duct is taking place.

This compartment is fed with expelled medium from these processing gaps.

Such expulsion of processing medium toward the discharge passage can be supported by a temporary small discharge of thrust medium 104 from the thrust chamber 36, with an established decrease in pressure in this chamber.

Within a very short period of time, for instance only 0.05 second, thereby approximately 0.2 $cm^3$ medium is expelled, with an established relatively considerable height of this circumferential discharge gap, approximately 10 $\mu m$.

By means of this expelling medium, at first an expulsion of residue medium, possibly containing micro contamination, is taking place from the cylindrical buffer compartment 184.

Simultaneously, gaseous rinse medium 78 is urged from the gaseous lock compartment 48 through a circumferential gap toward this discharge passage, with a discharge of the mixture from this discharge passage through the discharge lines.

A great number of successive up and downward displacements of this upper chamber wall thereby establish successive expulsions of continued cleaner medium from these processing gaps 174 and 176 toward this discharge passage 28.

In FIGS. $6^D$ and $7^D$ the upper chamber wall is moved upward again by means of a pressure reduction in the thrust compartment 668 and the pulsator chamber 142.

Subsequently, by new supplied medium, the expulsion of residue medium from these gaps 174 and 176 toward the buffer compartments 134 and 184 and eventually the discharge passage 28 is taking place, together with a filling of these gaps with this fresh medium.

Such expulsion medium at first can be solely gaseous medium, with subsequently the injection of a certain amount of liquid medium into at least the upper gap 174, whereby this medium jointly by means of the vibrations is uniformly spread over such gap.

Thereupon, the wafer processing in the processing chamber 24 repeats with this fresh medium.

Due to the limited volume of the discharge medium, such refreshments repeatedly take place for an optimal wafer processing.

In FIGS. $8^C$ and $9^C$ imaginary is shown, that for a wafer processing under an increased whirling action of the processing medium the upper chamber wall is provide with a mini undulation, which, within the scope of the invention, can have any other profile.

In FIGS. $10^A$ through $10^E$ and $11^A$ through $11^E$ such wafer processing, with a continuous further downward displacement of the central block section 34, is successively shown.

In FIGS. $12^A$ through $12^E$ and $13^A$ through $13^E$ thereby the positive lagging effect of the wafer 26 on the high pressure wafer processing according to FIGS. $10^E$ and $11^E$ is shown.

Thereby in FIG. $12^B$, still at the start of the downward displacement of the block section 34, a continued upward displacement of the wafer 26, due to this lagging effect, providing already in the first half of such compression stroke an increased pressurizing of the medium within the upper processing gap 174.

Thereby a shock-wave action of this medium takes place, with an increased action of it on the wafer topography 190, in particular in the second half of this compression stroke, see FIGS. $12^C$, $12^D$ and $12^E$.

In FIG. $12^F$ by means of an increase of the pressure in the thrust compartment 66B and whether or not by means of discharge of thrust medium from the thrust chamber 36, through which the block 20 over a micro distance is displaced downward, again expulsion takes place of the finished-off medium 30 from both processing gaps 174 and 176.

In FIGS. $13^A$ through $13^E$ the lagging effect of the wafer during the expansion stroke of block section 34 is shown.

Thereby at the start of this upward expansion stroke a still continued downward displacement of the wafer 26.

In FIGS. 14, 15, 16 and 18 wafer processing in the upper gap 174 at least almost solely with liquid medium 658 takes place.

In FIG. $14^A$ for that purpose the supply of this liquid medium 658 takes place through the central orifice 72, whereas through the central orifice 70 the medium 30, consisting of gaseous medium and whether or not in combination with vaporized or liquid medium, is supplied toward the lower gap 176.

Within the scope of the invention any type of liquid medium for any type of wafer processing is possible, such as for cleaning, etching, stripping and developing.

The block section 34 thereby is in its upper position, with a minimal amplitude of the vibrations.

FIG. $14^B$, with a stopped medium supply, and in at least almost the upper position of the lower chamber block 20, expulsion of the liquid medium 658 from the upper gap 174 takes place through the buffer compartments 134 and 184 toward the discharge passage 28, with also to a small extent the expulsion of processing medium form the lower gap 176 toward this discharge passage.

In FIGS. 15 and 16 wafer processing with the mediums 658 and 30 takes place in the processing chamber 24, which by means of this lower chamber block is hermetically sealed off.

In FIG. $15^A$, during the compression stroke, the block section 34 is moving downward. However, due to the relatively great mass of the wafer, it continues to move upward, because of the applied upward thrust of the medium 30 in the lower gap 176 thereon during the foregoing expansion stroke of this block section 34.

Due to this expansion stroke, together with the fast upward displacement of the block section with regard to that of the wafer, in this upper gap 174 vacuum bubbles 660 are accomplished under exploding action.

Thus, at first in gap 174 these vacuum bubbles are at least for the greater part thereof disposed of, see FIG. $15^B$. Thereby under imploding action an urging of atomized liquid particles under a relatively high pressure and velocity into the submicron valleys 192, which are located in the upper wall 190 of the wafer as wafer processing side, see also FIG. $18^A$.

In the end phase of the displacement of block section 34, as is shown in FIG. 15$^C$, the wafer 26 is further moved downward by this block section and the column liquid 658 in the upper gap, with a maximum compression of the compressible medium 30 in the lower gap 176.

This medium thereby functions as a buffer for absorbing and slowing down the established, relatively fast wafer displacement in downward direction.

In FIG. 16$^A$, with the subsequent upward expansion stroke of the block section 34, at first still a continued downward displacement of the wafer takes place, because of the foregoing applied thrust of the medium 658 thereon in downward direction.

Due to the considerable tractive power of the pulsator on this block 34, the film liquid 658 is dissolved, under the creation of submicron vacuum bubbles by exploding action, also within the valleys 192, see FIG. 18$^B$.

The liquid medium 658 therefore preferably has a low cohesion and adhesion coefficient.

Thus, an effective removal of the boundary layer 662 immediately above the wafer 25 occurs, see FIG. 18$^B$.

In case of wafer cleaning, thereby an effective cleaning of such submicron valleys take place, whereby for instance during 1 second 5000–40,000 repeats of such cleaning cycle occur.

In particular by means of the great amplitude, for instance 10 $\mu$m, of the pulsator vibrations, the established thrusts of the medium 658 on the wafer topography 190 are great, however, without any damage of the wafer, because through a micro gaseous cushion its entire lower wall is supported by the lower chamber block.

Due to the also established considerably vertical reciprocations of the wafer 26, also in the lower gap 176 an effective processing of the lower side 664 of the wafer takes place.

Another favourable method of processing is shown in FIGS. 17, 19, 20 and 21.

After the central injection liquid medium 658 into the upper gap 174, see FIG. 17$^A$, the central block section 34 to a small extent is moved upward, see FIG. 17$^B$.

Consequently, in particular during the upward expansion stroke of this block section the suctioning of at least gaseous medium 78 from the buffer compartment 184 aside the wafer 26 takes place.

Within the scope of the invention also, and whether or not additionally, the injection of a small volume of gaseous medium, for instance 10 mm$^3$, through the central supply orifice 72 can take place.

In this way, within the upper gap 174 a liquid-rich mixture is established.

Within the scope of the invention it is also possible to centrally supply such liquid-rich mixture.

After the subsequent downward displacement of the block section 34, the wafer processing takes place within the hermetically sealed off chamber 24.

In FIGS. 20$^A$ and 20$^B$ thereby the phases of the compression stroke, with at first a still upward displacement of the wafer, are shown.

Here too, in the end phase of this compression stroke a hefty action of the medium mixture 658/78 on the wafer upper side 190 takes place.

Thereby, due to the hefty micro whirling action of this mixture, also an entering of even such submicron valleys 192 by this mixture is accomplished, see FIG. 19$^A$.

During the subsequent, not shown expansion stroke of the block section 34, due to the sharp pressure reduction in such submicron valleys, a partly expulsion of medium under whirling action occurs, see FIG. 19$^B$.

In the combination of FIGS. 20 and 21 is shown, that thereby during the wafer processing also the vertical position of the block section 34 can vary independent of its vibrations, for in particular an optimal cleaning of the submicron valleys.

Within the scope of the invention any type of pulsator and any size thereof, depending on the required vibration energy, are possible.

In FIG. 24 the wafer 26 under floating condition is moved from the sender section 66 of the transfer block 44 in the direction of the processing chamber 24.

Thereby, for maintaining this floating condition, a supply of gaseous medium 78 through the supply orifices 70 and 74, located in the lower chamber block, takes place.

The flow of medium from the orifice 70 is urged in a sloped direction toward this wafer, thereby providing the small required thrust on this wafer in the direction of the wafer stop 556 in this chamber 24.

In the shown wafer position the sensor 554 has observed the passing through of the wafer, and whereby by means of an inpuls toward a valve in the supply line 70 the supply of medium in this end phase of wafer displacement is enlarged.

The back end 450 of the wafer thereby still is within the relatively narrow supply passage 558, with due to the vibrating gaseous medium in the gap 454 above the wafer still the maintaining of the floating condition for this wafer, as shown in FIGS. 26$^A$ and 36$^B$.

However, the front end 456 of the wafer, due to this upward thrust of the gaseous medium, is moved upward over a small distance, as shown in FIGS. 25 and 27.

The vibrating upper chamber wall 34 thereby provides a whirling action of the gaseous medium 78 in the processing chamber, and such in particular in the lower gap, with a uniform spreading of the medium over the wafer surface and a considerable slowing-down effect of this medium on the wafer.

By means of successive supplies and discharges of a small amount of liquid thrust medium 104, approximately 3 cm$^3$, toward and from the thust chamber 36, see FIG. 1, also the lower chamber block is reciprocated over a small distance, approximately 0.1 mm.

In addition, the upper chamber wall 34 is also reciprocated with a low frequency and a relatively great amplitude, approximately 0.1 mm.

Such is shown in FIGS. 26$^A$, 26$^B$, 27 and 28.

In FIG. 26$^A$ thereby an upward displacement of the upper chamber wall 34 and a downward displacement of the lower chamber block 20 take place, with an established negative pressure within both gaps 452 and 454, whereas in FIG. 26$^B$, during the downward compression stroke of this upper chamber wall 34 and the upward displacement of the lower chamber block, a compression of this medium occurs in these gaps.

Consequently, for the wafer back end 450 a double-floating condition is temporarily maintained.

The wafer front end 456 however, is moved upward toward such level, that with a continued wafer displacement the wafer front side 562 comes to a stop against the vertical sidewall 556 of the processing chamber 24, as is shown in FIGS. 28 and 29.

The slowing-down action of the reciprocating flows of medium on the wafer thereby prevents the moving backward of the wafer over a distance more than 1 mm, and at the end this wafer comes to a rest position against this wall.

Thereby the lower section 570 of this sidewall 556 is conical for an eventual guidance of the wafer toward its position within this chamber.

Subsequently, the lower chamber block 20 is moved upward, as shown in FIG. 30, with a centric position of the wafer within the chamber 24, whereafter the supply of medium 78 toward the lower chamber block is stopped, with a temporary dissolving of the floating condition for the wafer.

Subsequently, the combination of block 20 and wafer by means of a discharge of medium 104 from the chamber 36, is moved toward its lowest position, to enable the transfer block 44 to move toward its wafer receive position at the other side of the module.

In FIG. 31 the wafer processing apparatus 10 with its exit 202 is connected with the main processing module 204. Thereby by means of the transfer arm 42 a processed wafer 26' is brought onto successive positions 206 of the turntable 208 within this module 204.

Thereby in this apparatus 10 an all-sided wafer cleaning takes place.

The same apparatus can also function for the post treatment of the wafer, such as cleaning, etching, stripping or developing, and whereby this wafer is supplied from such module 204, with the side 202 being the entrance side.

Within the scope of the invention any other type and method of wafer transfer is possible.

Furthermore, within the scope of the invention the apparatus can contain more than one module.

Furthermore, in at least one of the walls of the processing chamber a heating element for instance proximity- or de-hydration bake can be located.

Furthermore, such oven bake of the wafer can take place in successive modules, with a subsequent cooling-off in following modules.

Furthermore, in any of the shown processing modules of the apparatus and in a whether or not adapted form, the following wafer processing in whether or not a combination thereof can take place:

cleaning, ultrasonic cleaning, megasonic cleaning, plasma cleaning;

developing;

etching, plasma etching;

stripping, plasma stripping;

oven bake, including micro-wave oven - and hot-plate oven bake;

dopant processing;

chemical vapor deposition;

physical vapor deposition, plasma deposition;

deposition of coatings in vapor or gaseous phase, vacuum deposition of primers in vapor phase;

oxidation systems; and wafer testing, measuring, inspection and marking.

Thereby, for instance in a first module an all-sided cleaning of the wafer and in a following module proximity bake or even de-hydration bake of the wafer.

Furthermore, the pulsator can be arranged in a single or multiple version, whether or not located underneath the lower chamber block and having any size.

We claim:

1. Apparatus in the form of a module for transfer and processing of wafers comprising:
   a. a supporting base;
   b. a combination of lower chamber block and upper chamber block, superposed upon said base so as to define a wafer processing chamber between the chamber blocks;
   c. a reciprocal wall defined in at least one of said chamber blocks so as to abut a portion of said processing chamber;
   d. a circumferential membrane arranged along the periphery of said wafer processing chamber, so as to at least temporarily seal said processing chamber circumference; and
   e. a pulsator attached to said reciprocal wall so as to at least temporarily reciprocate a portion of said reciprocal wall and thereby vary the height of said processing chamber during processing.

2. Apparatus in the form of a module for transfer and processing wafers as in claim 1, further comprising at least during the wafer processing a supply of pressurized gaseous medium communicating with said processing chamber so as to support a wafer in contact-free double floating condition within said processing chamber.

3. Apparatus in the form of a module for transfer and processing of wafers as in claim 1, at least one of said chamber blocks including a central section having a compression/decompression chamber at least temporarily supplied by pressurized thrust medium, so as to reciprocate said central section and thus a wall of said processing chamber to successive vertical positions.

4. Apparatus in the form of a module for transfer and processing wafers as in claim 3, including means for at least temporarily independent displacement of said central section so as to assist in medium discharge from said processing chamber.

5. Apparatus in the form of a module for transfer and processing of wafers as in claim 4, wherein said means for independent displacement of said central portion at least includes gaseous medium.

6. Apparatus in the form of a module for transfer and processing of wafers as in claim 5, including a medium discharge section extending laterally beyond said circumferential membrane.

7. Apparatus in the form of a module for transfer and processing wafers as in claim 6, including a gaseous lock chamber extending laterally beyond said gaseous medium discharge section so as to prevent discharge of processing medium laterally outwardly said medium discharge passage during processing.

8. Apparatus in the form of a module for transfer and processing of wafers as in claim 4, said chamber blocks including a central section defining a processing medium supply passage.

9. Apparatus in the form of a module for transfer and processing of wafers as in claim 8, wherein said processing medium includes gaseous media.

10. Apparatus in the form of a module for transfer and processing of wafers as in claim 9, wherein said processing medium includes a mixture of both gaseous and vaporized media.

11. Apparatus in the form of a module for transfer and processing of wafers as in claim 9, wherein said processing medium includes a mixture of gaseous and liquid media.

12. Apparatus in the form of a module for transfer and processing of wafers as in claim 9, wherein said processing medium includes both gaseous and liquid phase.

13. Apparatus in the form of a module for transfer and processing of wafers as in claim 9, wherein said apparatus interfaces with wafer handling devices.

14. Apparatus in the form of a module for transfer and processing of wafers as in claim 9, wherein said apparatus is adapted for at least one of the following: cleaning, etching, developing, stripping, dopant processing, lithographic application of coating, chemical deposition, physical vapor depositions, high temperature evaporation, deposition of coatings and oven baking.

15. A method of processing wafers comprising:
   a. defining a wafer processing chamber of variable height by means of a fixed section and a reciprocating section;
   b. at least temporarily circumferentially sealing said chamber with a flexible membrane intermediate said fixed and reciprocating sections;
   c. supplying pressurized gaseous medium into said processing chamber so as to double float a wafer being processed therein, while;
   d. vibrating said processing chamber by reciprocating one of said chamber blocks with respect to another of said chamber blocks.

16. A method of processing wafers as in claim 15, wherein said reciprocating of one of said chamber blocks is accomplished by means of pressurized fluid successively supplied to and discharged from a pulsator chamber defined aside said reciprocating block.

17. A method of processing wafers as in claim 16, wherein said reciprocating is accomplished by vibrating action of a hydraulic pulsator.

18. A method of processing wafers as in claim 17, wherein said pressurized gaseous medium supplied into said processing chamber provides at least temporarily a contact free double floating condition for said wafer within said processing chamber.

19. A method of processing wafers as in claim 17, including at least temporarily laterally outwardly discharging processing medium from said processing chamber beyond said flexible membrane.

20. A method of processing wafers as in claim 19, further including providing a gaseous lock laterally beyond said circumferential discharge so as to prevent outward discharge of gaseous medium during processing and discharging.

21. A method of processing wafers as in claim 19, including at least temporarily providing a supplementary gaseous medium discharge thrust on said reciprocating chamber block as an assistance in processing medium discharge from said chamber.

22. A method of processing wafers as in claim 21, wherein said processing medium includes gaseous medium.

23. A method of processing wafers as in claim 22, wherein said processing medium includes both gaseous and liquid medium.

24. A method of processing wafers as in claim 22, wherein said processing medium includes a mixture of gaseous and vaporized medium.

25. A method of processing wafers as in claim 22, wherein said processing medium includes both vapor and liquid phase.

26. A method of processing wafers as in claim 15, wherein said processing includes at least one of the following: cleaning, etching, developing, stripping dopant processing, deposition and oven bake.

27. Apparatus in the form of a module for transfer and processing of wafers comprising:
   a. a supporting base;
   b. a combination of lower chamber block and upper chamber block, superposed upon said base so as to define a wafer processing chamber between the chamber blocks;
   c. a reciprocal wall defined in at least one of said chamber blocks so as to abut a portion of said processing chamber.
   d. a wafer supply device supported adjacent each said chamber block for transfer of successive wafers into said processing chamber;
   e. a wafer discharge device supported adjacent each said chamber block for transfer of successive wafers from said processing chamber;
   f. a circumferential membrane arranged along the periphery of said wafer processing chamber, so as to at least temporarily seal said processing chamber circumference; and
   g. a pulsator attached to said reciprocal wall so as to reciprocate a portion of one said chamber block and thereby vary the height of said processing chamber during processing.

* * * * *